US011222881B2

(12) United States Patent
Zhang et al.

(10) Patent No.: US 11,222,881 B2
(45) Date of Patent: *Jan. 11, 2022

(54) THREE-DIMENSIONAL MEMORY DEVICE WITH LOGIC SIGNAL ROUTING THROUGH A MEMORY DIE AND METHODS OF MAKING THE SAME

(71) Applicant: SANDISK TECHNOLOGIES LLC, Addison, TX (US)

(72) Inventors: Yanli Zhang, San Jose, CA (US); Kwang-Ho Kim, Pleasanton, CA (US); Johann Alsmeier, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/900,486

(22) Filed: Jun. 12, 2020

(65) Prior Publication Data

US 2020/0343235 A1    Oct. 29, 2020

Related U.S. Application Data

(63) Continuation of application No. 16/261,869, filed on Jan. 30, 2019, now Pat. No. 10,727,215.

(51) Int. Cl.
*G11C 16/00* (2006.01)
*H01L 25/18* (2006.01)
(Continued)

(52) U.S. Cl.
CPC .......... *H01L 25/18* (2013.01); *G11C 16/0483* (2013.01); *H01L 23/481* (2013.01); *H01L 24/08* (2013.01); *H01L 24/80* (2013.01); *H01L 25/0657* (2013.01); *H01L 25/50* (2013.01); *H01L 27/1157* (2013.01);
(Continued)

(58) Field of Classification Search
CPC . H01L 25/18; H01L 25/0652; H01L 27/1157; H01L 25/0657; H01L 2224/08146; H01L 2225/06524; H01L 2224/80894; H01L 21/8221; H01L 25/00; G11C 5/025; G11C 16/0483; G11C 16/08; G11C 16/30; G11C 16/26
See application file for complete search history.

(56) References Cited

U.S. PATENT DOCUMENTS 5,915,167 A   6/1999  Leedy
6,917,219 B2  7/2005  New
(Continued)

OTHER PUBLICATIONS

Endoh, T. et al., "Novel Ultra High Density Flash Memory with A Stacked-Surrounding Gate Transistor (S-GT) Structured Cell," IEDM Proc., pp. 33-36, (2001).
(Continued)

*Primary Examiner* — Alfredo Bermudez Lozada
(74) *Attorney, Agent, or Firm* — The Marbury Law Group PLLC

(57) ABSTRACT

A memory device includes a memory die containing memory elements, a support die containing peripheral devices and bonded to the memory die, and an electrically conductive path between two of the peripheral devices which extends at least partially through the memory die. The electrically conductive path is electrically isolated from the memory elements.

20 Claims, 36 Drawing Sheets

(51) Int. Cl.

| | | |
|---|---|---|
| *H01L 25/065* | (2006.01) | |
| *H01L 25/00* | (2006.01) | |
| *H01L 23/00* | (2006.01) | |
| *H01L 23/48* | (2006.01) | |
| *H01L 27/11524* | (2017.01) | |
| *H01L 27/11556* | (2017.01) | |
| *H01L 27/11529* | (2017.01) | |
| *H01L 27/1157* | (2017.01) | |
| *H01L 27/11582* | (2017.01) | |
| *H01L 27/11573* | (2017.01) | |
| *G11C 16/04* | (2006.01) | |
| *G11C 16/26* | (2006.01) | |
| *G11C 16/08* | (2006.01) | |
| *G11C 16/30* | (2006.01) | |
| *H01L 27/11519* | (2017.01) | |
| *H01L 27/11565* | (2017.01) | |

(52) U.S. Cl.
CPC .. *H01L 27/11524* (2013.01); *H01L 27/11529* (2013.01); *H01L 27/11556* (2013.01); *H01L 27/11573* (2013.01); *H01L 27/11582* (2013.01); *G11C 16/08* (2013.01); *G11C 16/26* (2013.01); *G11C 16/30* (2013.01); *H01L 27/11519* (2013.01); *H01L 27/11565* (2013.01); *H01L 2224/08146* (2013.01); *H01L 2224/80894* (2013.01); *H01L 2225/06524* (2013.01); *H01L 2225/06541* (2013.01); *H01L 2924/1431* (2013.01); *H01L 2924/14511* (2013.01)

(56) References Cited

U.S. PATENT DOCUMENTS

| | | | |
|---|---|---|---|
| 7,005,310 B2 | 2/2006 | Hanada et al. | |
| 9,287,268 B2 | 3/2016 | Zhao et al. | |
| 10,068,879 B2 | 9/2018 | Gowda | |
| 10,510,629 B2 | 12/2019 | Chen et al. | |
| 10,636,767 B2 * | 4/2020 | Haba | G07D 7/003 |
| 10,727,215 B1 * | 7/2020 | Zhang | H01L 27/11524 |
| 2004/0166763 A1 | 8/2004 | Hanada et al. | |
| 2004/0178819 A1 | 9/2004 | New | |
| 2005/0116138 A1 | 6/2005 | Hanada et al. | |
| 2006/0091487 A1 | 5/2006 | Hanada et al. | |
| 2007/0210175 A1 | 9/2007 | Okumura | |
| 2007/0283191 A1 | 12/2007 | McDonald-Maier et al. | |
| 2015/0263005 A1 | 9/2015 | Zhao et al. | |
| 2016/0079164 A1 | 3/2016 | Fukuzumi et al. | |
| 2016/0300815 A1 | 10/2016 | Kim | |
| 2017/0040338 A1 | 2/2017 | Lee et al. | |
| 2017/0154873 A1 | 6/2017 | Kim et al. | |
| 2017/0373084 A1 | 12/2017 | Shim et al. | |
| 2018/0082981 A1 | 3/2018 | Gowda | |
| 2018/0102251 A1 | 4/2018 | Delacruz et al. | |
| 2019/0006316 A1 | 1/2019 | Yu et al. | |

OTHER PUBLICATIONS

International Patent Application No. PCT/US2019/062746, International Search Report and Written Opinion, dated Mar. 17, 2020, 9 pgs.

U.S. Appl. No. 15/873,101, filed Jan. 17, 2018, Sandisk Technologies LLC.

U.S. Appl. No. 15/892,648, filed Feb. 9, 2018, Sandisk Technologies LLC.

U.S. Appl. No. 15/928,340, filed Mar. 22, 2018, Sandisk Technologies LLC.

U.S. Appl. No. 15/928,407, filed Mar. 22, 2018, Sandisk Technologies LLC.

U.S. Appl. No. 15/960,267, filed Apr. 23, 2018, Sandisk Technologies LLC.

U.S. Appl. No. 15/979,885, filed May 15, 2018, Sandisk Technologies LLC.

U.S. Appl. No. 16/231,752, filed Dec. 24, 2018, Sandisk Technologies LLC.

U.S. Appl. No. 16/241,171, filed Jan. 7, 2019, Sandisk Technologies LLC.

U.S. Appl. No. 16/241,221, filed Jan. 7, 2019, Sandisk Technologies LLC.

U.S. Appl. No. 16/242,216, filed Jan. 8, 2019, Sandisk Technologies LLC.

U.S. Appl. No. 16/243,469, filed Jan. 9, 2019, Sandisk Technologies LLC.

U.S. Appl. No. 16/248,923, filed Jan. 16, 2019, Sandisk Technologies LLC.

U.S. Appl. No. 16/251,782, filed Jan. 18, 2019, Sandisk Technologies LLC.

U.S. Appl. No. 16/251,954, filed Jan. 18, 2019, Sandisk Technologies LLC.

U.S. Appl. No. 16/255,413, filed Jan. 23, 2019, Sandisk Technologies LLC.

U.S. Appl. No. 16/261,869, filed Jan. 30, 2019, Sandisk Technologies LLC.

* cited by examiner

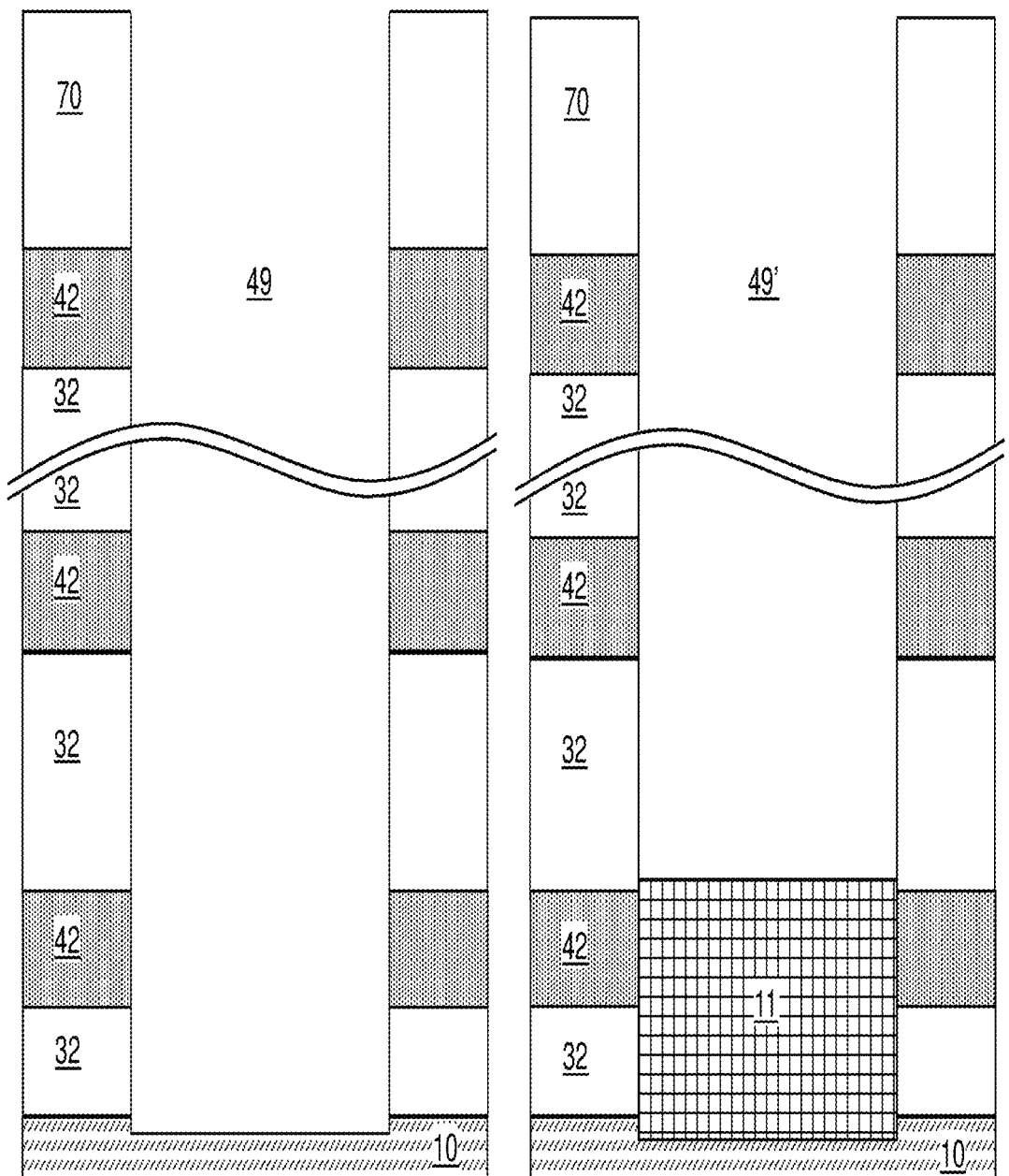

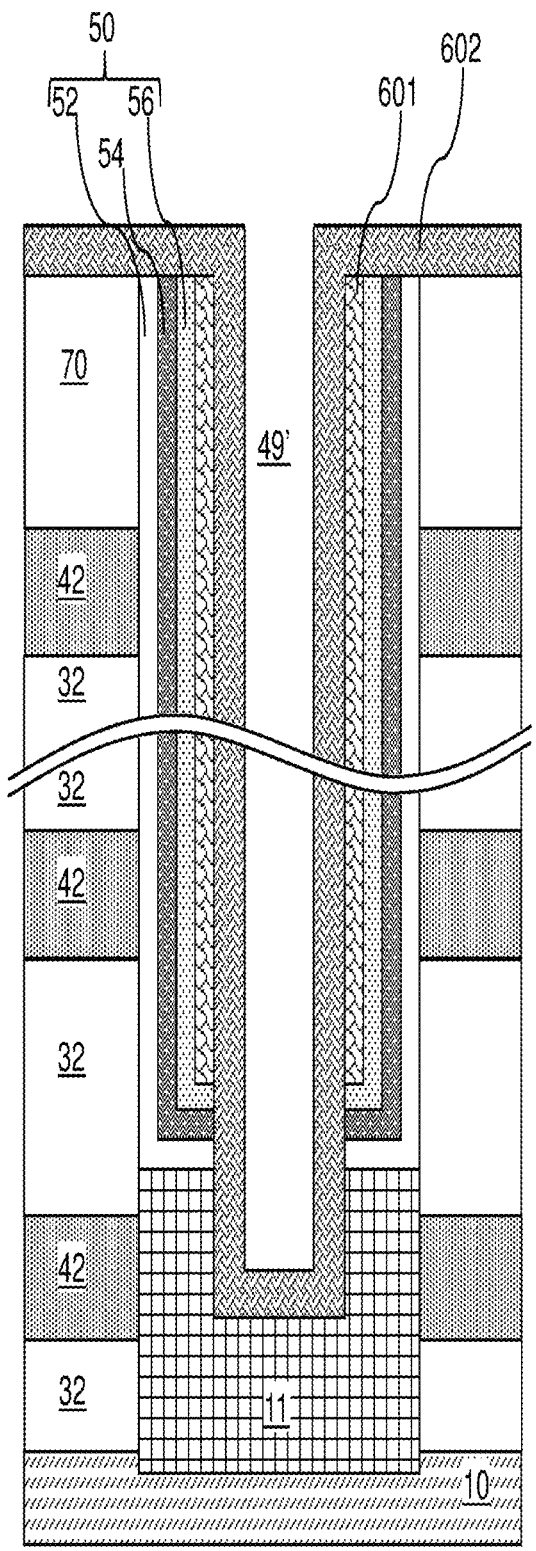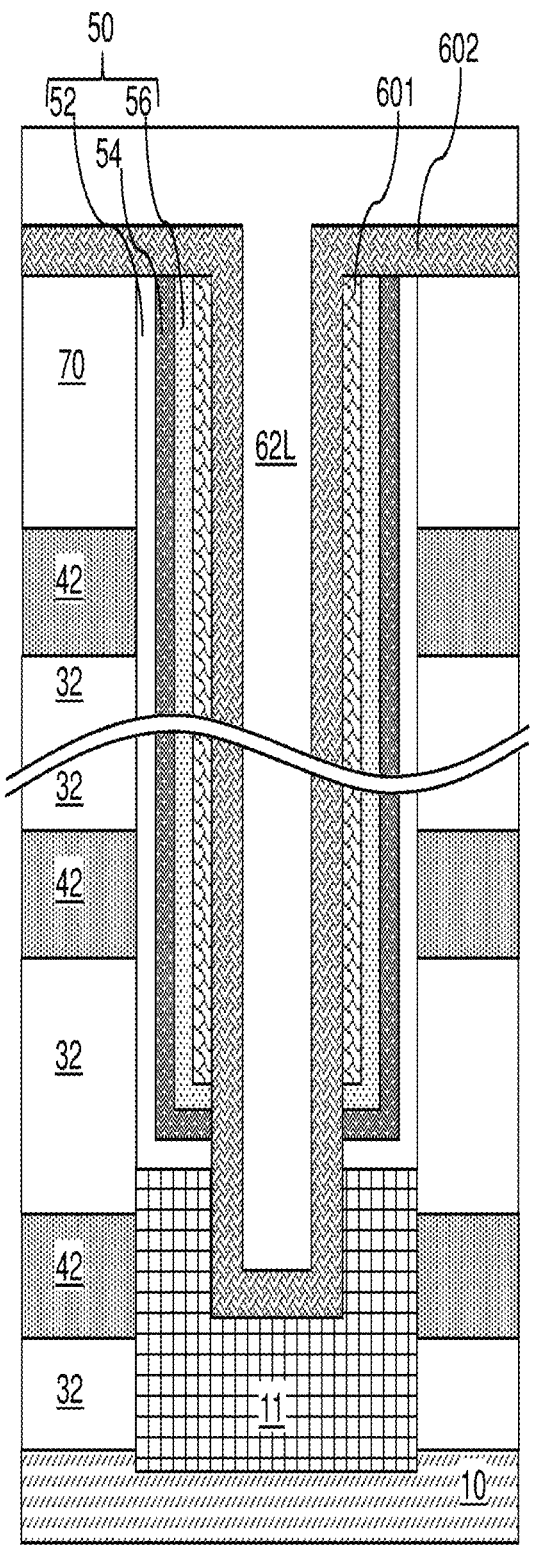

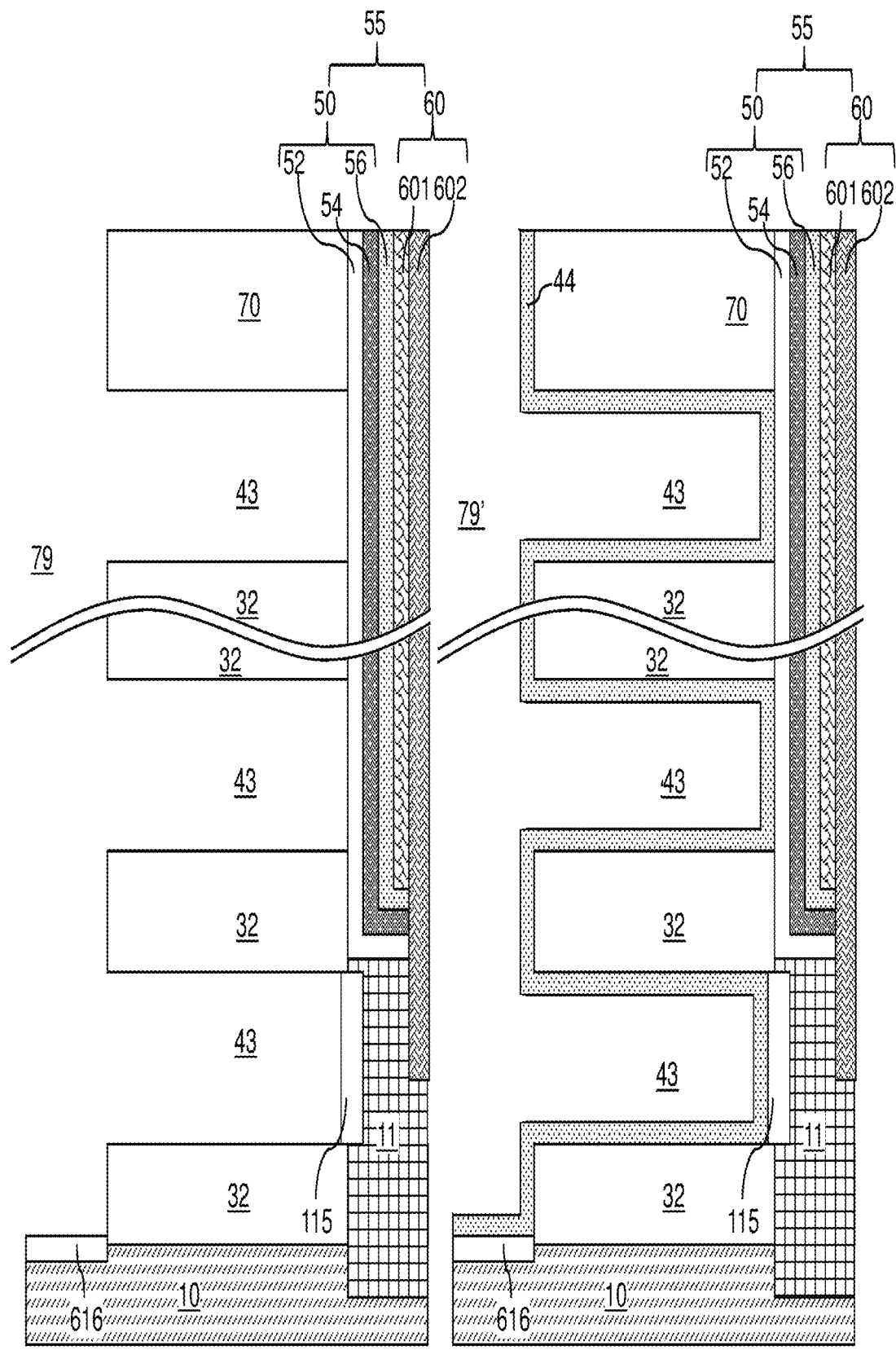

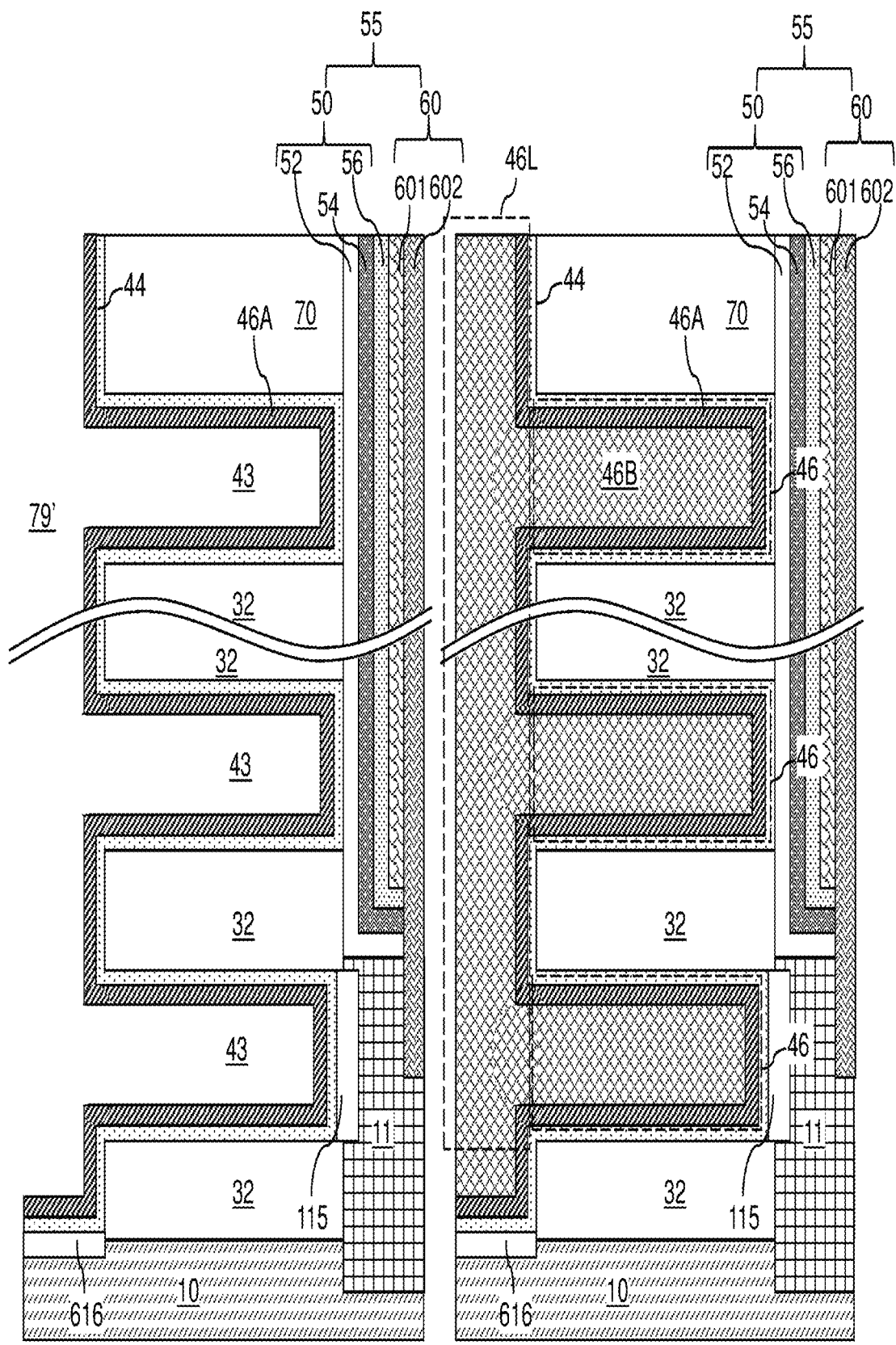

US 11,222,881 B2

THREE-DIMENSIONAL MEMORY DEVICE WITH LOGIC SIGNAL ROUTING THROUGH A MEMORY DIE AND METHODS OF MAKING THE SAME

RELATED APPLICATIONS

The present application is a continuation application of U.S. application Ser. No. 16/261,869 filed on Jan. 30, 2019 and issued as U.S. Pat. No. 10,727,215 on Jul. 28, 2020.

FIELD

The present disclosure relates generally to the field of semiconductor devices, and particular to a three-dimensional memory chip using logic signal routing through a memory die and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36. Support circuitry is required to perform write, read, and erase operations of the memory cells in the vertical NAND strings. The support circuitry can be provided by forming complementary metal oxide semiconductor (CMOS) devices on a same substrate as the three-dimensional memory device. Alternatively, the support circuitry can be provided in a support die that is bonded to a memory die including a three-dimensional memory device.

SUMMARY

According to an embodiment of the present disclosure, a memory device includes a memory die containing memory elements, a support die containing peripheral devices and bonded to the memory die, and an electrically conductive path between two of the peripheral devices which extends at least partially through the memory die. The electrically conductive path is electrically isolated from the memory elements.

According to another embodiment of the present disclosure, a method for forming a memory device comprises providing a memory die comprising memory elements and an interconnect which is electrically isolated from the memory elements, providing a support die comprising peripheral devices, and bonding the memory die to the support die such that an electrically conductive path between two of the peripheral devices includes the interconnect.

BRIEF DESCRIPTION OF THE DRAWINGS

FIGS. 4A-4H are sequential schematic vertical cross-sectional views of a memory opening within the exemplary structure during formation of a memory stack structure, an optional dielectric core, and a drain region therein according to an embodiment of the present disclosure.

FIGS. 8A-8D are sequential vertical cross-sectional views of a region of the exemplary structure during formation of electrically conductive layers according to an embodiment of the present disclosure.

DETAILED DESCRIPTION

Figure 1:
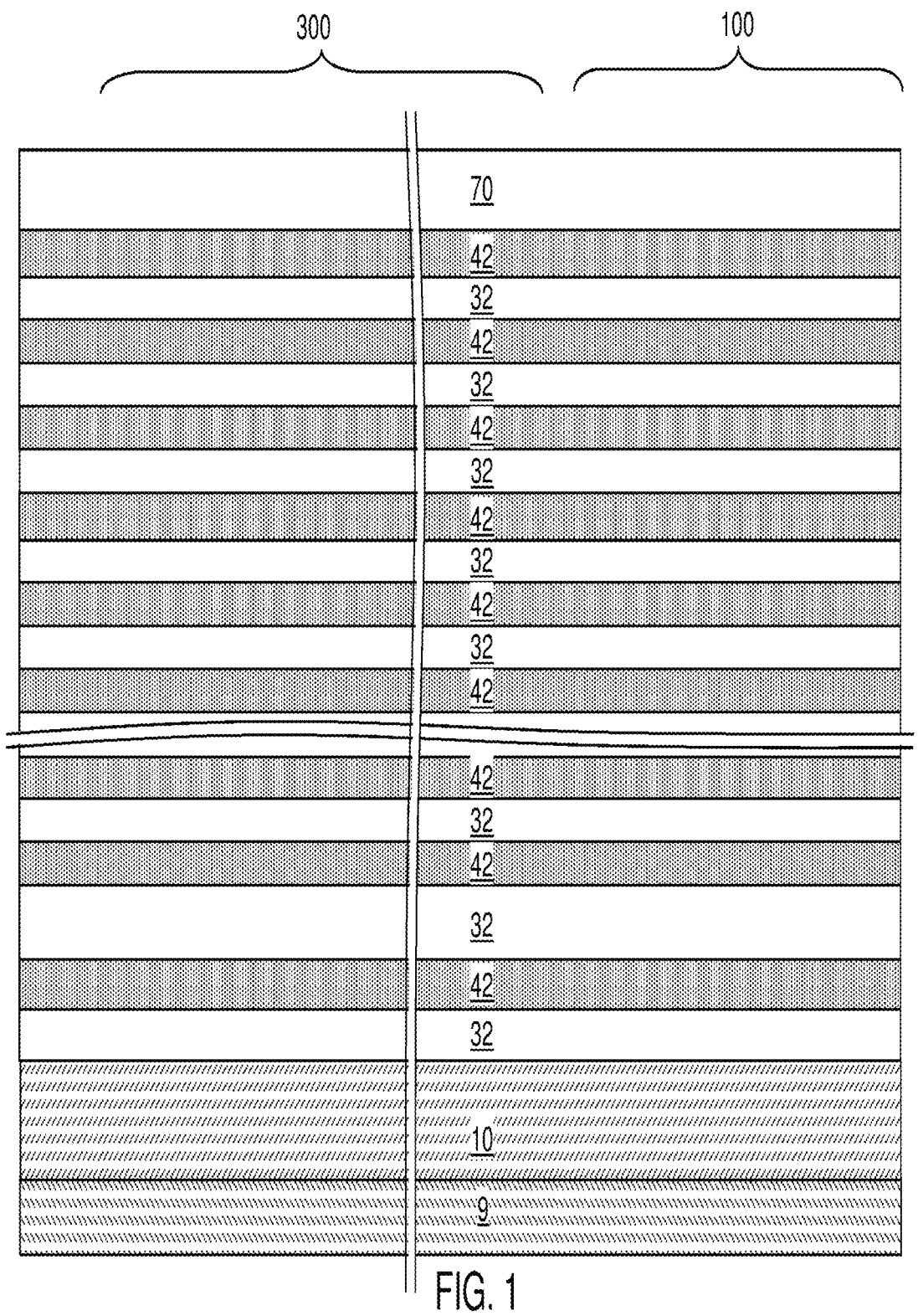
FIG. 1 is a schematic vertical cross-sectional view of an exemplary structure after formation of an alternating stack of insulating layers and sacrificial material layers according to an embodiment of the present disclosure.

As discussed above, various embodiments of the present disclosure are directed to a bonded chip using logic signal routing through a memory die and methods of manufacturing the same, the various aspects of which are described below. Three-dimensional memory chips can be formed using vertical NAND strings. Support circuitry is required to perform write, read, and erase operations of the memory cells in the vertical NAND strings. Typically, complementary metal oxide semiconductor (CMOS) devices are formed on a same substrate as the three-dimensional memory device. However, degradation of peripheral circuitry due to collateral thermal cycling and hydrogen diffusion during manufacture of the three-dimensional memory device places a severe constraint on performance of the support circuitry including the peripheral circuitry. Further, the number of word lines in an alternating stack of insulating layers and word lines is limited due to constraints of the etch process used to pattern the alternating stack. Thus, the total number of word lines that can be vertically stacked is limited in a three-dimensional memory device under the scheme proposed by Endoh et al. Therefore, a structure is desired that may incorporate a greater number of word lines and a high-performance support circuitry. The embodiments of the disclosure can be used to form various structures including a multilevel memory structure, non-limiting examples of which include semiconductor devices such as three-dimensional monolithic memory array devices comprising a plurality of NAND memory strings. The embodiments of the disclosure can be used to form a three-dimensional memory device of a memory die and a semiconductor die, which can be a support die or an additional memory die.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays can be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates can be thinned or removed from the memory levels before bonding, but as the memory levels are initially formed over separate substrates, such memories are not true monolithic three-dimensional memory arrays. Three-dimensional memory devices of various embodiments of the present disclosure include monolithic three-dimensional NAND string memory devices, and can be fabricated using the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations can be executed in each plane within a same die, although there can be some restrictions. When a die is a memory die, i.e., a die including memory elements, concurrent read operations, concurrent write operations, or concurrent erase operations can be performed in each plane within a same memory die. Each plane contains a number of memory blocks (or "blocks"), which are the smallest unit that can be erased by in a single erase operation. Each memory block contains a number of pages, which are the smallest units that can be selected for programming.

Referring to FIG. 1, an exemplary structure according to an embodiment of the present disclosure is illustrated, which can be used, for example, to fabricate a device structure containing vertical NAND memory devices. The exemplary structure includes a substrate (9, 10), which can be a semiconductor substrate. The substrate may include a substrate semiconductor layer 9 and an optional semiconductor material layer 10. The substrate semiconductor layer 9 may be a semiconductor wafer or a semiconductor material layer, and may include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" can be a heavily doped semiconductor material, or can be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material can be semiconducting or conductive, and can be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A stack of an alternating plurality of first material layers (which can be insulating layers 32) and second material layers (which can be sacrificial material layer 42) can be formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers can begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack may include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) may include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which may function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 may include silicon oxide, and sacrificial material layers may include silicon nitride sacrificial material layers. The first material of the insulating layers 32 can be deposited, for example, by chemical vapor deposition (CVD). For example, if silicon oxide is used for the insulating layers 32, tetraethyl orthosilicate (TEOS) can be used as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 may function as electrically conductive electrodes, such as the control gate electrodes of the monolithic three-dimensional NAND string memory devices to be subsequently formed. The sacrificial material layers 42 may comprise a portion having a strip shape extending substantially parallel to a top surface of the substrate (9, 10).

The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions may also be used. The top and bottom gate electrodes in the stack may function as the select gate electrodes. In one embodiment, each sacrificial material layer 42 in the alternating stack (32, 42) may have a uniform thickness that is substantially invariant within each respective sacrificial material layer 42.

While the descriptions of the present disclosure use an embodiment in which the spacer material layers are sacrificial material layers 42 that are subsequently replaced with electrically conductive layers, in other embodiments the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 may include a dielectric material that can be used for the insulating layers 32 as described above. The insulating cap layer 70 may have a greater thickness than each of the insulating layers 32. The insulating cap layer 70 can be deposited, for example, by chemical vapor deposition. In one embodiment, the insulating cap layer 70 can be a silicon oxide layer.

Figure 2A:
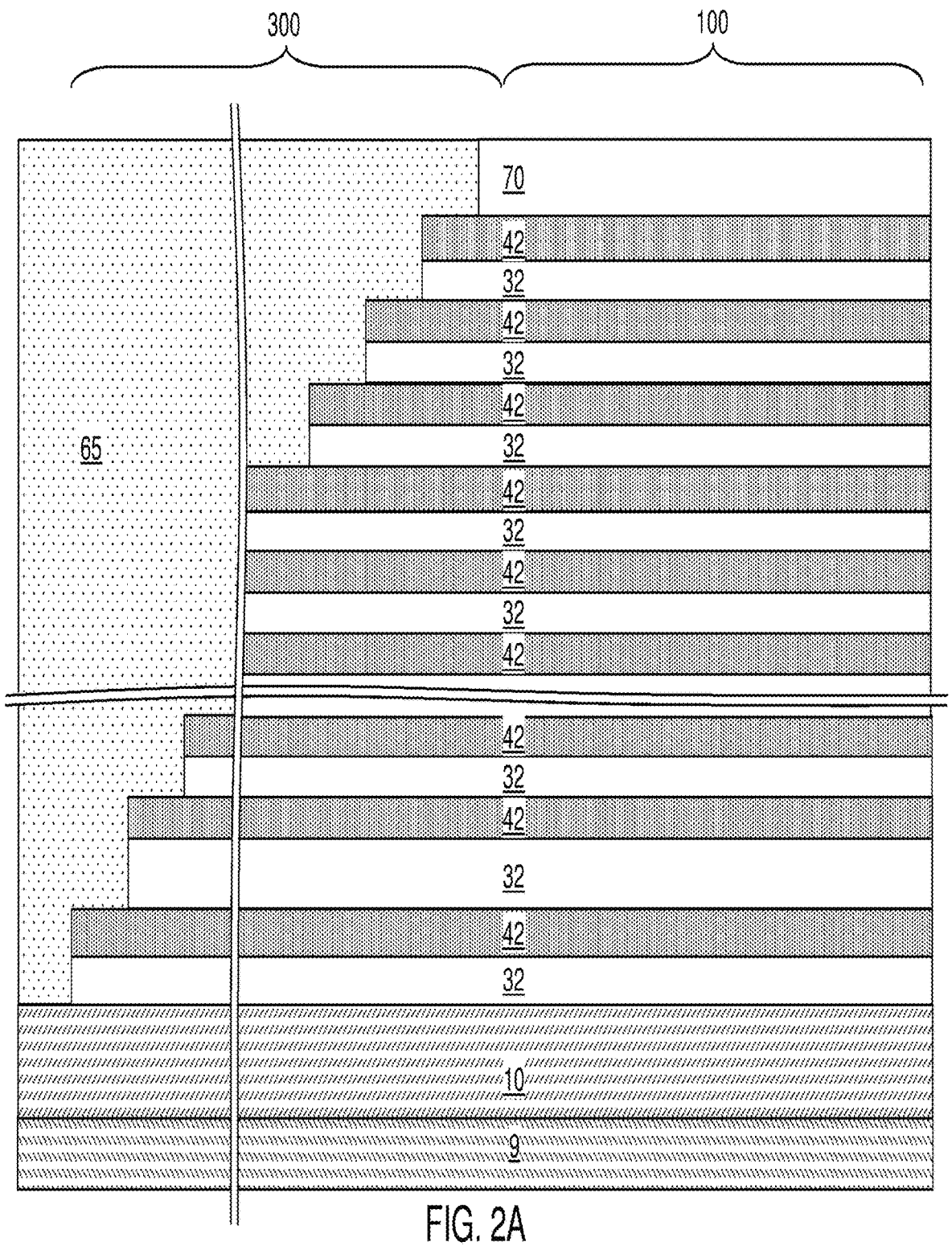
FIG. 2A is a schematic vertical cross-sectional view of the exemplary structure after formation of stepped terraces and a retro-stepped dielectric material portion according to an embodiment of the present disclosure.
Figure 2B:
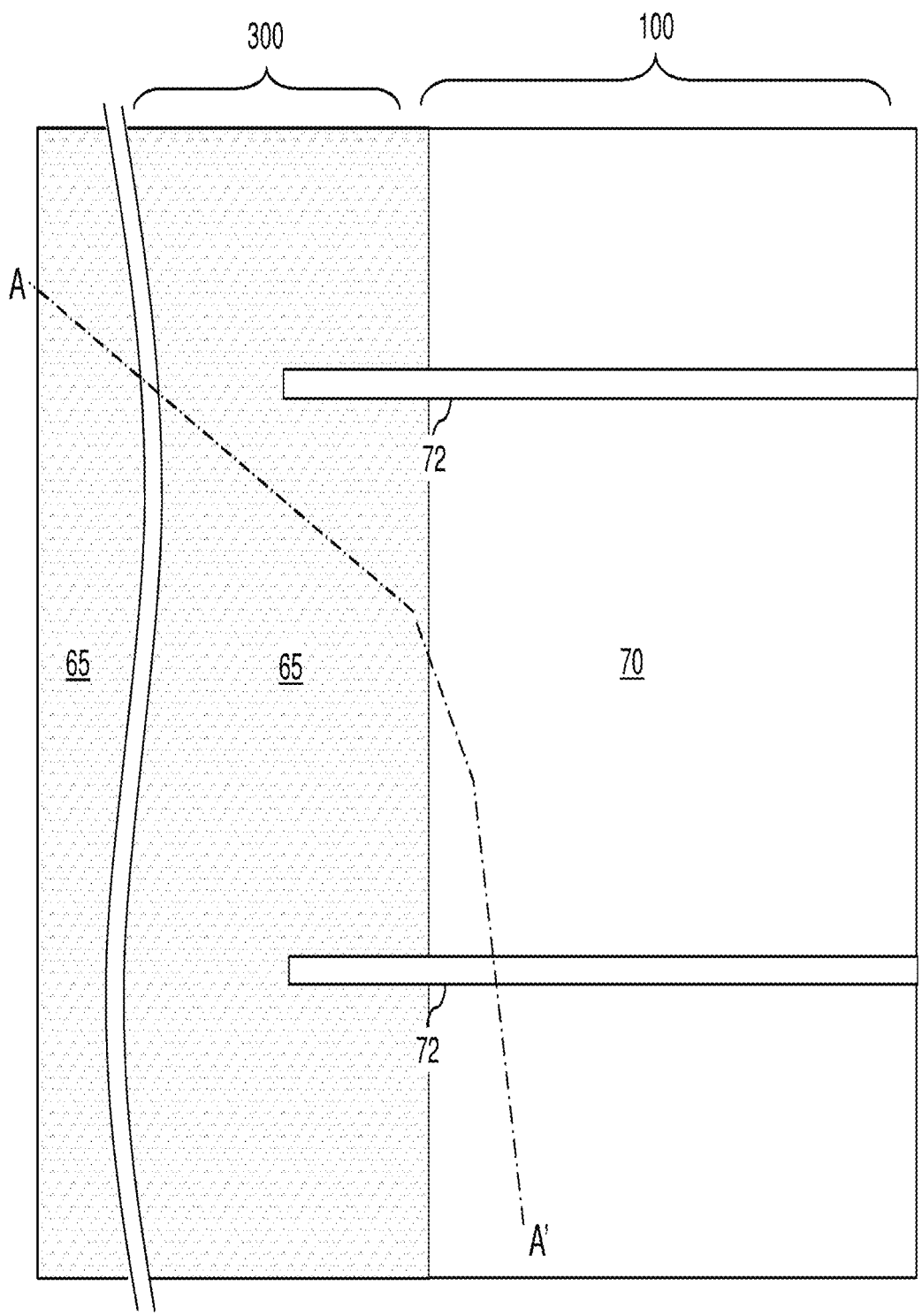
FIG. 2B is a top-down view of the exemplary structure of FIG. 2A. The vertical plane A-A' is the plane of the cross-section for FIG. 2A.

Referring to FIGS. 2A and 2B, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located adjacent to the memory array region 100. The stepped cavity may have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps may include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces may have the height of one or more pairs of an insulating layer 32 and a sacrificial material layer. In one embodiment, each vertical step may have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset one from another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations using three, four, or more columns of staircases with a respective set of vertical offsets formed along the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases can be arranged along the first horizontal direction hd1, and the columns of staircases can be arranged along a second horizontal direction hd2 that is perpendicular to the first horizontal direction hd1. In one embodiment, the first horizontal direction hd1 can be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain-select-levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 3A:
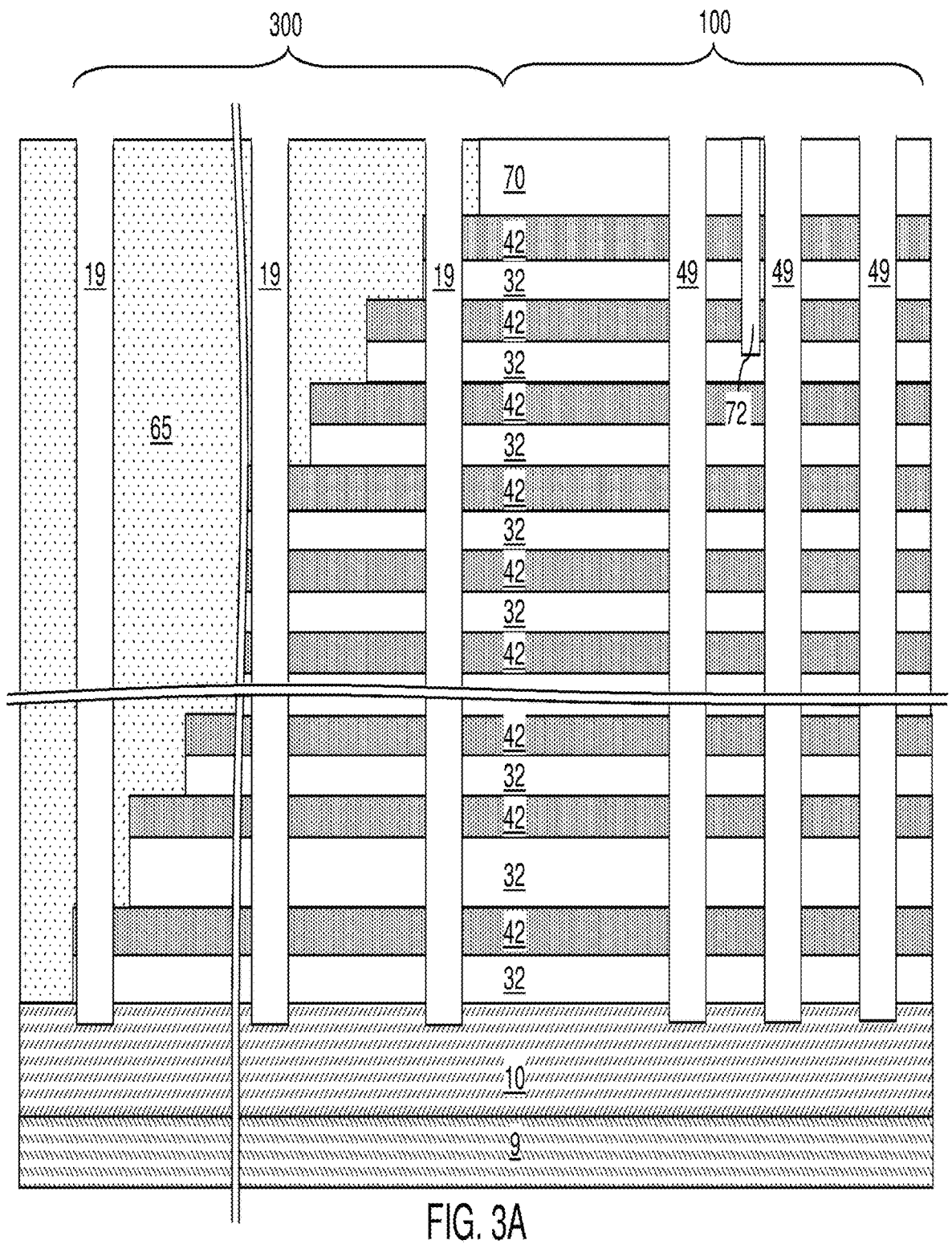
FIG. 3A is a schematic vertical cross-sectional view of the exemplary structure after formation of memory openings and support openings according to an embodiment of the present disclosure.
Figure 3B:
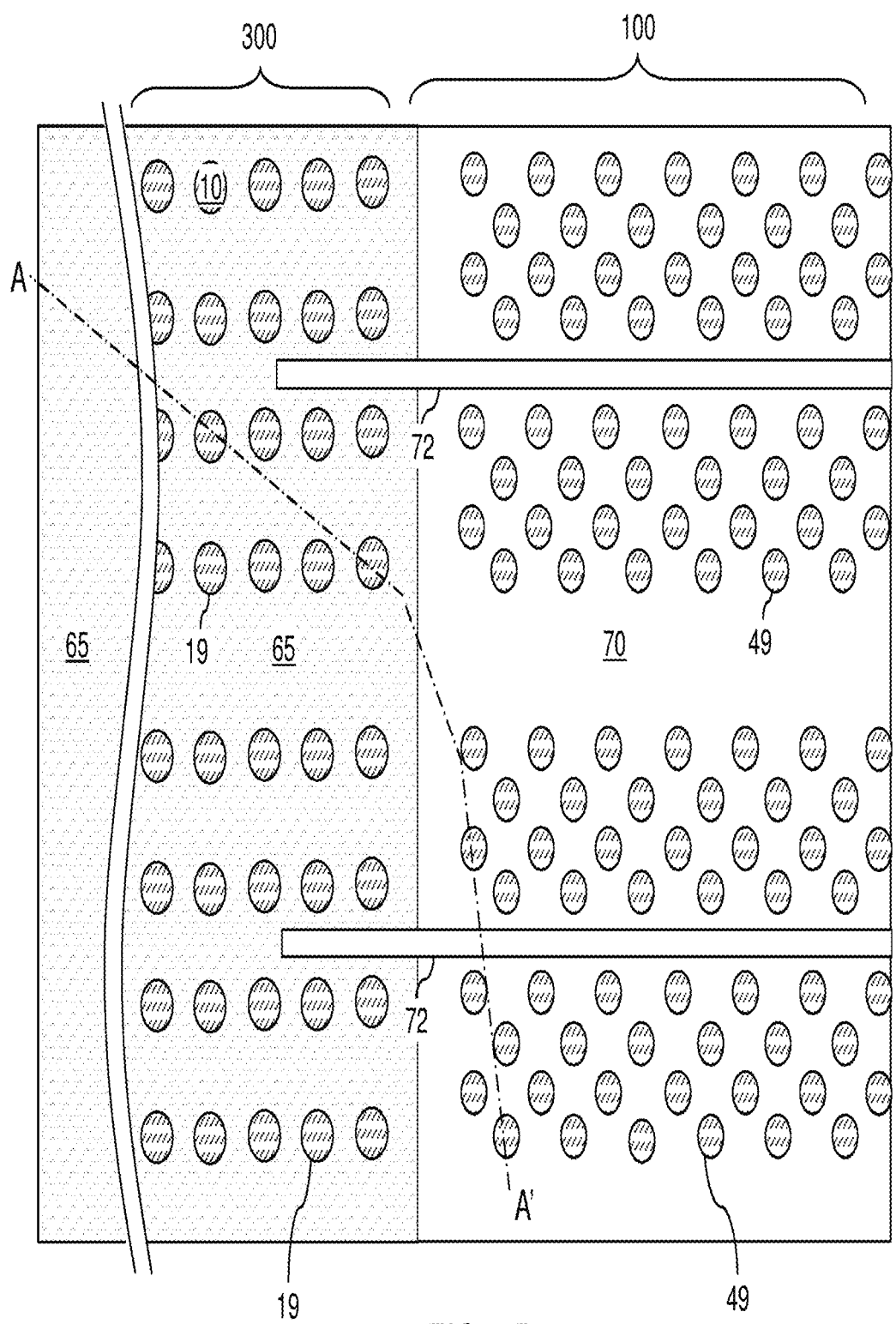
FIG. 3B is a top-down view of the exemplary structure of FIG. 3A. The vertical plane A-A' is the plane of the cross-section for FIG. 3A.

Referring to FIGS. 3A and 3B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) may alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 may extend from the top surface of the alternating stack (32, 42) to at least the horizontal plane including the topmost surface of the semiconductor material layer 10. In one embodiment, an overetch into the semiconductor material layer 10 can be optionally performed after the top surface of the semiconductor material layer 10 is physically exposed at a bottom of each memory opening 49 and each support opening 19. The overetch can be performed prior to, or after, removal of the lithographic material stack. In other words, the recessed surfaces of the semiconductor material layer 10 can be vertically offset from the un-recessed top surfaces of the semiconductor material layer 10 by a recess depth. The recess depth can be, for example, in a range from 1 nm to 50 nm, although lesser and greater recess depths may also be used. The overetch (as shown in the figures) is optional, and can be omitted. If the overetch is not performed, the bottom surfaces of the memory openings 49 and the support openings 19 can be coplanar with the topmost surface of the semiconductor material layer 10 (not shown).

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 can be omitted, and the memory openings 49 and the support openings 19 can be extend to a top surface of the substrate semiconductor layer 9.

FIGS. 4A-4H illustrate structural changes in a memory opening 49, which is one of the memory openings 49 in the exemplary structure of FIGS. 3A and 3B. The same structural change occurs simultaneously in each of the other memory openings 49 and in each support opening 19.

Referring to FIG. 4A, a memory opening 49 in the exemplary device structure of FIGS. 3A and 3B is illustrated. The memory opening 49 extends through the insulating cap layer 70, the alternating stack (32, 42), and optionally into an upper portion of the semiconductor material layer 10. At this processing step, each support opening 19 may extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths may also be used. Optionally, the sacrificial material layers 42 can be laterally recessed partially to form lateral recesses (not shown), for example, by an isotropic etch.

Referring to FIG. 4B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 may comprise single crystalline silicon. In one embodiment, the pedestal channel portion 11 may have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which may have a doping of the first conductivity type.

Figure 4C:
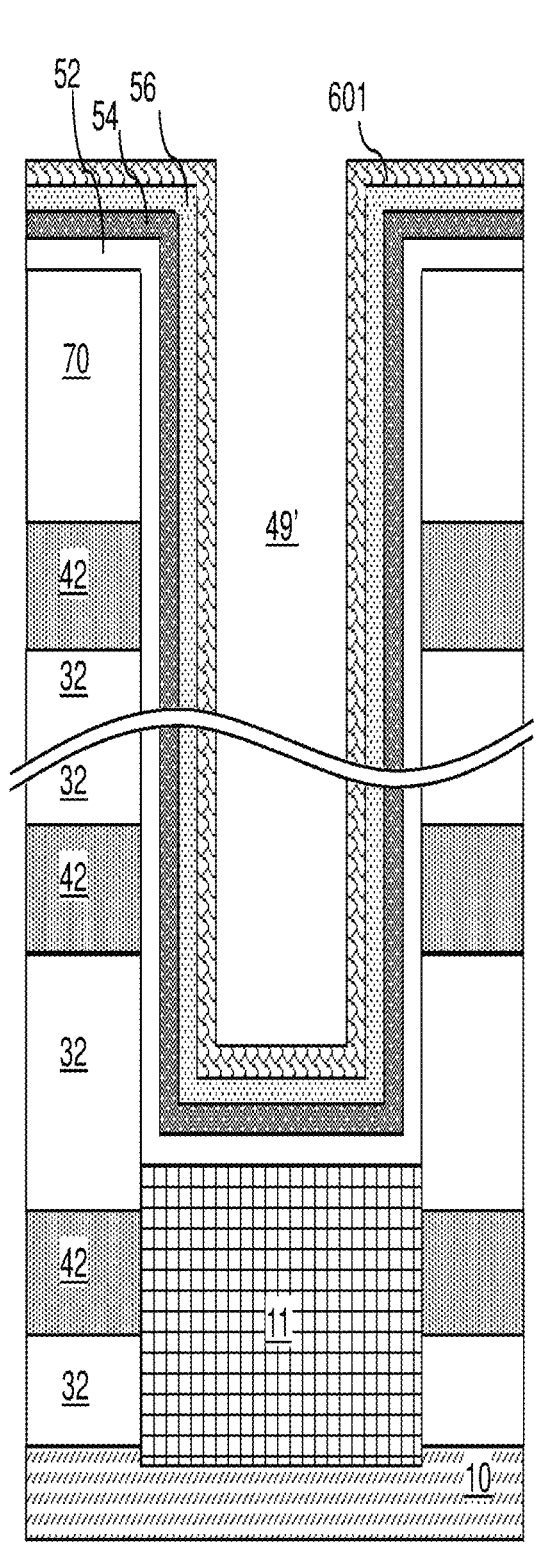

Referring to FIG. 4C, a stack of layers including a blocking dielectric layer 52, a charge storage layer 54, a tunneling dielectric 56, and an optional first semiconductor channel layer 601 can be sequentially deposited in the memory openings 49.

The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. In one embodiment, the blocking dielectric layer 52 may include multiple dielectric metal oxide layers having different material compositions.

Alternatively or additionally, the blocking dielectric layer 52 may include a dielectric semiconductor compound such as silicon oxide, silicon oxynitride, silicon nitride, or a combination thereof. In one embodiment, the blocking dielectric layer 52 may include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses may also be used. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 may have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be used to form the charge storage layer 54 as a plurality of memory material portions that are vertically spaced apart. While the descriptions in the present disclosure use an embodiment in which the charge storage layer 54 is a single continuous layer, in other embodiments the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or may include a stack of multiple charge storage layers. The multiple charge storage layers, if used, may comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses may also be used.

The tunneling dielectric 56 includes a dielectric material through which charge tunneling can be performed under suitable electrical bias conditions. The charge tunneling can be performed through hot-carrier injection or by Fowler-Nordheim tunneling induced charge transfer depending on the mode of operation of the monolithic three-dimensional NAND string memory device to be formed. The tunneling dielectric 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric 56 may include a stack of a first silicon oxide layer, a silicon oxynitride layer, and a second silicon oxide layer, which is commonly known as an ONO stack. In one embodiment, the tunneling dielectric 56 may include a silicon oxide layer that is substantially free of carbon or a silicon oxynitride layer that is substantially free of carbon. The thickness of the tunneling dielectric 56 can be in a range from 2 nm to 20 nm, although lesser and greater thicknesses may also be used.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses may also be used. A memory cavity 49' is formed in the volume of each memory opening 49 that is not filled with the deposited material layers (52, 54, 56, 601).

Figure 4D:
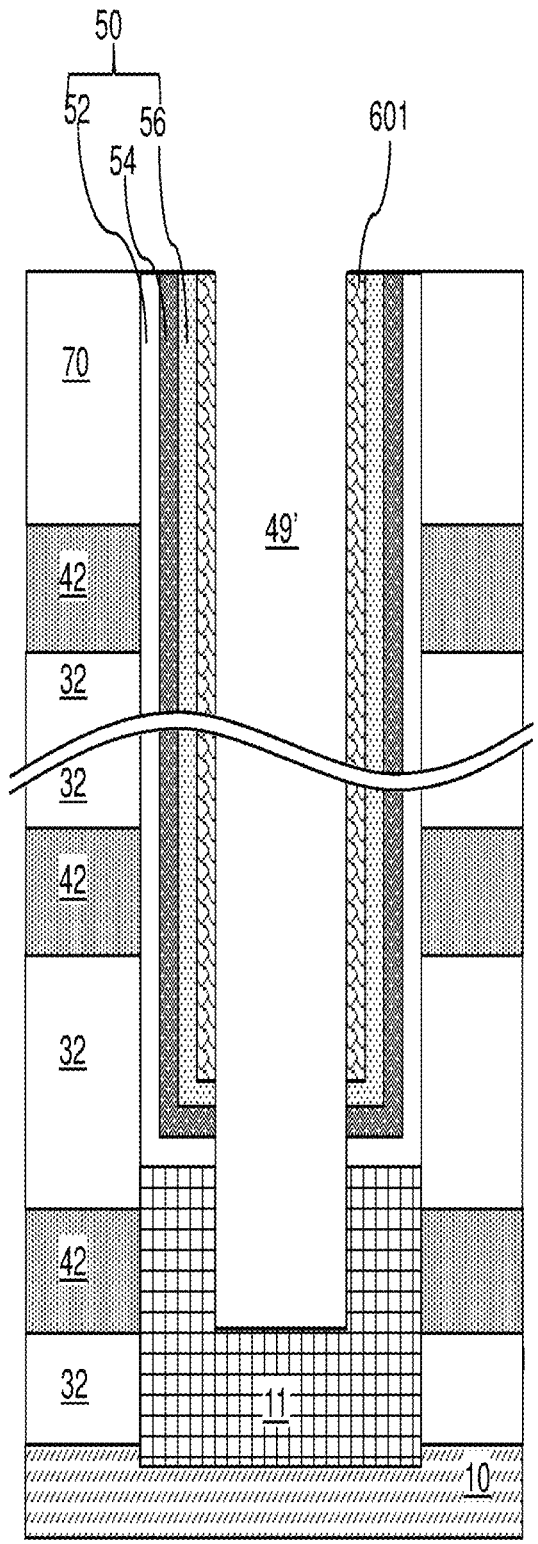

Referring to FIG. 4D, the optional first semiconductor channel layer 601, the tunneling dielectric 56, the charge storage layer 54, the blocking dielectric layer 52 are sequentially anisotropically etched using at least one anisotropic etch process. The portions of the first semiconductor channel layer 601, the tunneling dielectric 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric 56, the charge storage layer 54, and the blocking dielectric layer 52 at a bottom of each memory cavity 49' can be removed to form openings in remaining portions thereof. Each of the first semiconductor channel layer 601, the tunneling dielectric 56, the charge storage layer 54, and the blocking dielectric layer 52 can be etched by a respective anisotropic etch process using a respective etch chemistry, which may, or may not, be the same for the various material layers.

Each remaining portion of the first semiconductor channel layer 601 may have a tubular configuration. The charge storage layer 54 may comprise a charge trapping material or a floating gate material. In one embodiment, each charge storage layer 54 may include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not used) can be physically exposed underneath the opening through the first semiconductor channel layer 601, the tunneling dielectric 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not used) by a recess distance. A tunneling dielectric 56 is located over the charge storage layer 54. A set of a blocking dielectric layer 52, a charge storage layer 54, and a tunneling dielectric 56 in a memory opening 49 constitutes a memory film 50, which includes a plurality of charge storage regions (comprising the charge storage layer 54) that are insulated from surrounding materials by the blocking dielectric layer 52 and the tunneling dielectric 56. In one embodiment, the first semiconductor channel layer 601, the tunneling dielectric 56, the charge storage layer 54, and the blocking dielectric layer 52 may have vertically coincident sidewalls.

Referring to FIG. 4E, a second semiconductor channel layer 602 can be deposited directly on the semiconductor surface of the pedestal channel portion 11 or the semiconductor material layer 10 if the pedestal channel portion 11 is optionally omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses may also be used. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 4F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 4G:
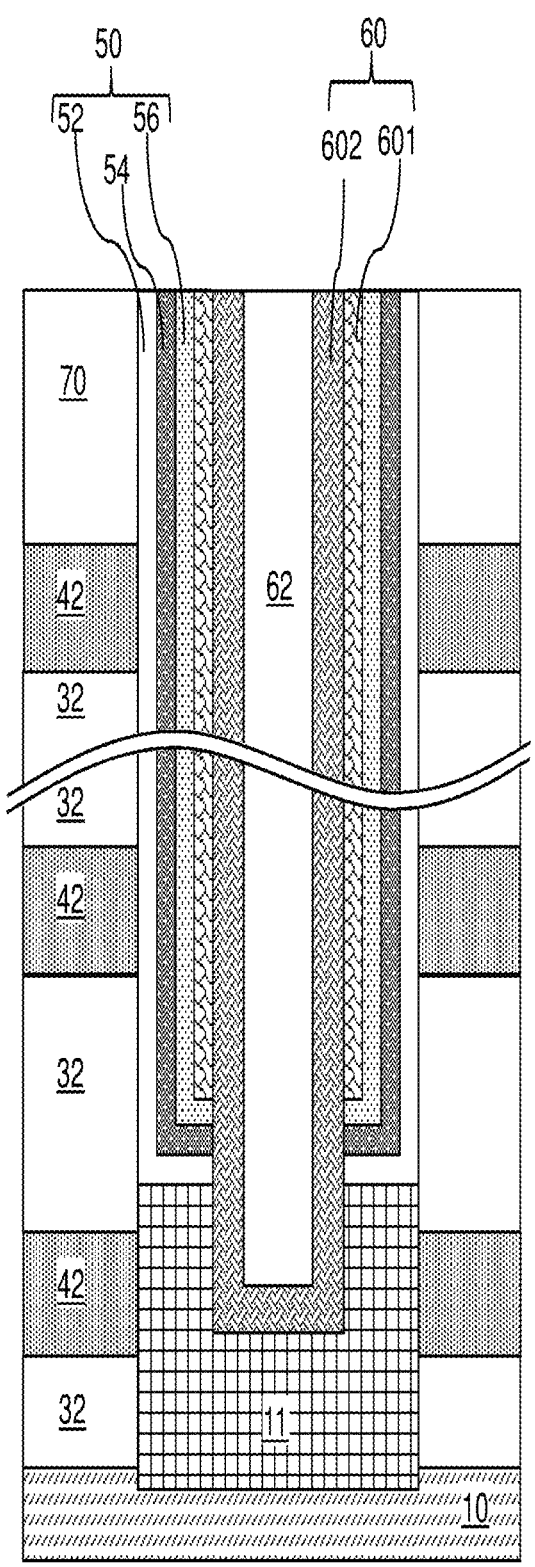

Referring to FIG. 4G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which may use a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 may collectively form a vertical semiconductor channel 60 through which electrical current may flow when a vertical NAND device including the vertical semiconductor channel 60 is turned on. A tunneling dielectric 56 is surrounded by a charge storage layer 54, and laterally surrounds a portion of the vertical semiconductor channel 60. Each adjoining set of a blocking dielectric layer 52, a charge storage layer 54, and a tunneling dielectric 56 collectively constitute a memory film 50, which may store electrical charges with a macroscopic retention time. In some embodiments, a blocking dielectric layer 52 may not be present in the memory film 50 at this step, and a blocking dielectric layer can be subsequently formed after formation of backside recesses. As used herein, a macroscopic retention time refers to a retention time suitable for operation of a memory device as a permanent memory device such as a retention time in excess of 24 hours.

Figure 4H:
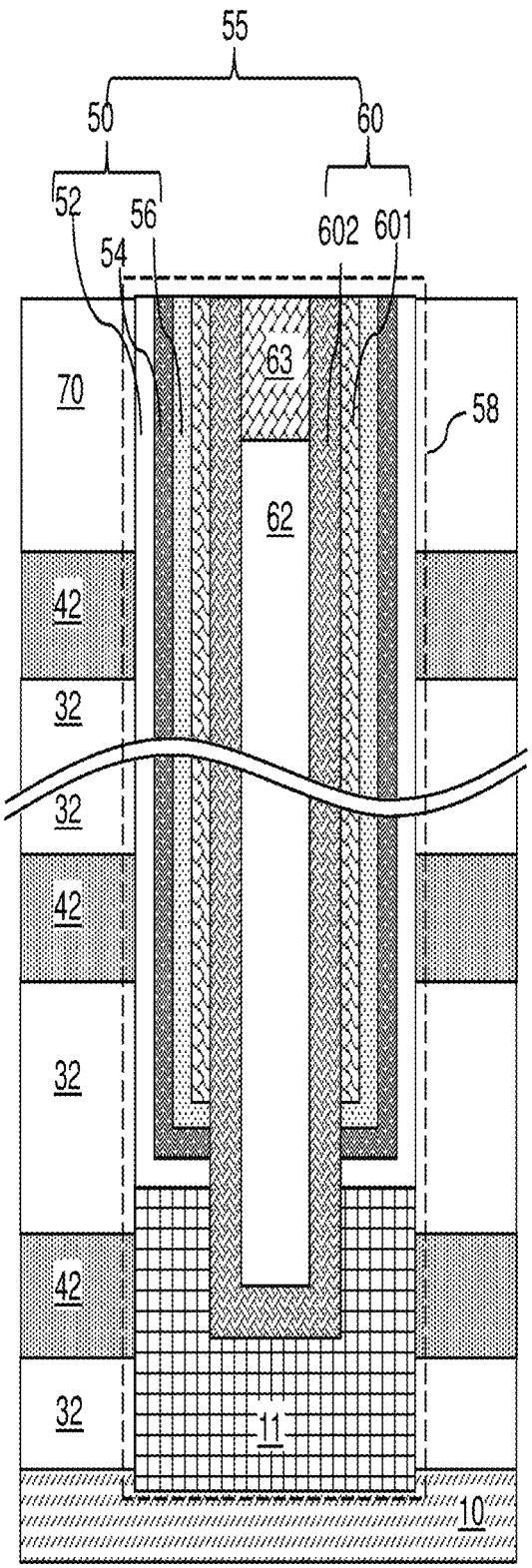

Referring to FIG. 4H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 may have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations may also be used. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric, a plurality of memory elements comprising portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 5:
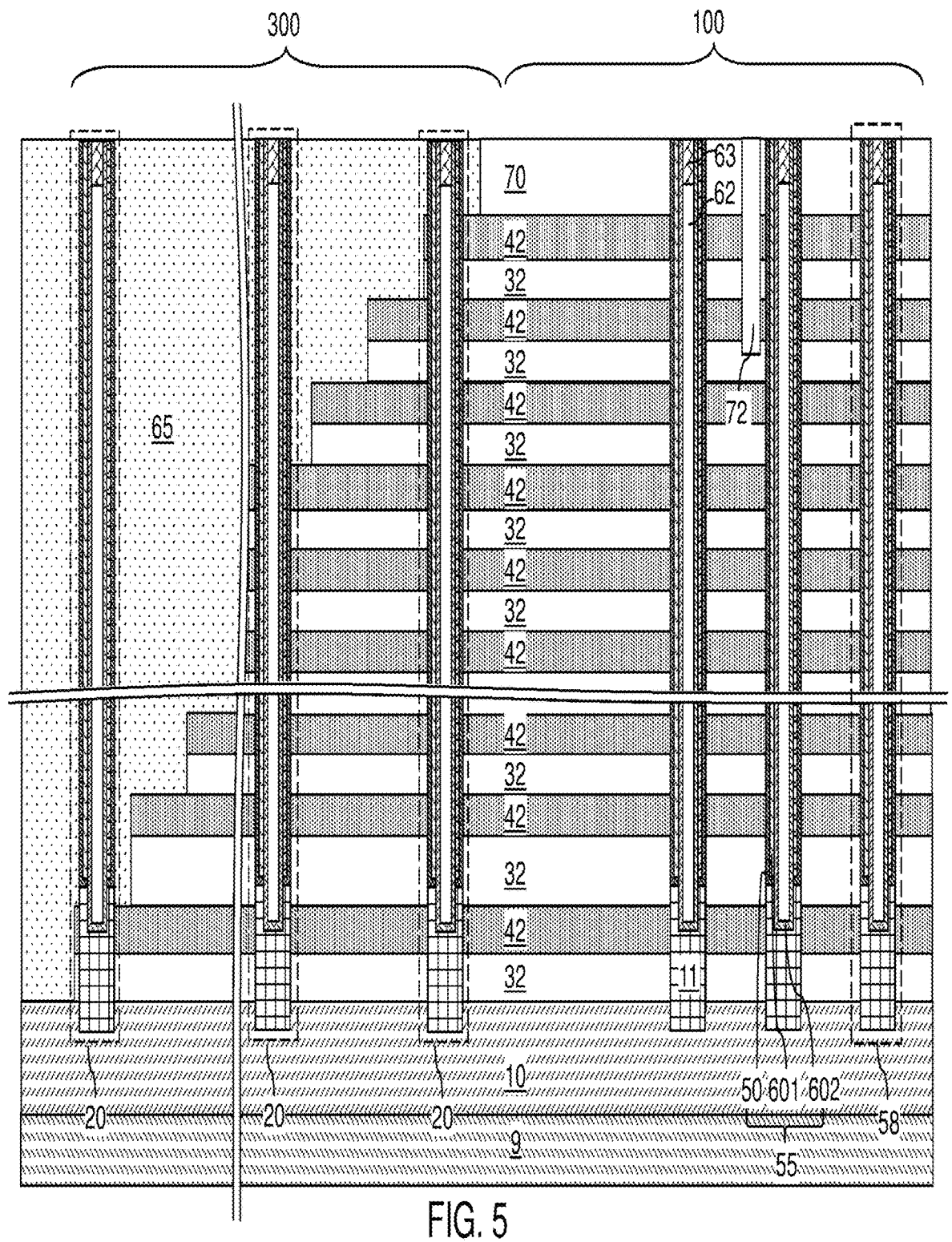
FIG. 5 is a schematic vertical cross-sectional view of the exemplary structure after formation of memory stack structures and support pillar structures according to an embodiment of the present disclosure.

Referring to FIG. 5, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric 56 laterally surrounding the vertical semiconductor channel 60 and a vertical stack of charge storage regions laterally surrounding the tunneling dielectric 56 (comprising a charge storage layer 54) and an optional blocking dielectric layer 52. While the descriptions in present disclosure use the illustrated configuration for the memory stack structure, the methods of various embodiments of the present disclosure can be applied to alternative memory stack structures including different layer stacks or structures for the memory film 50 and/or for the vertical semiconductor channel 60.

Figure 6A:
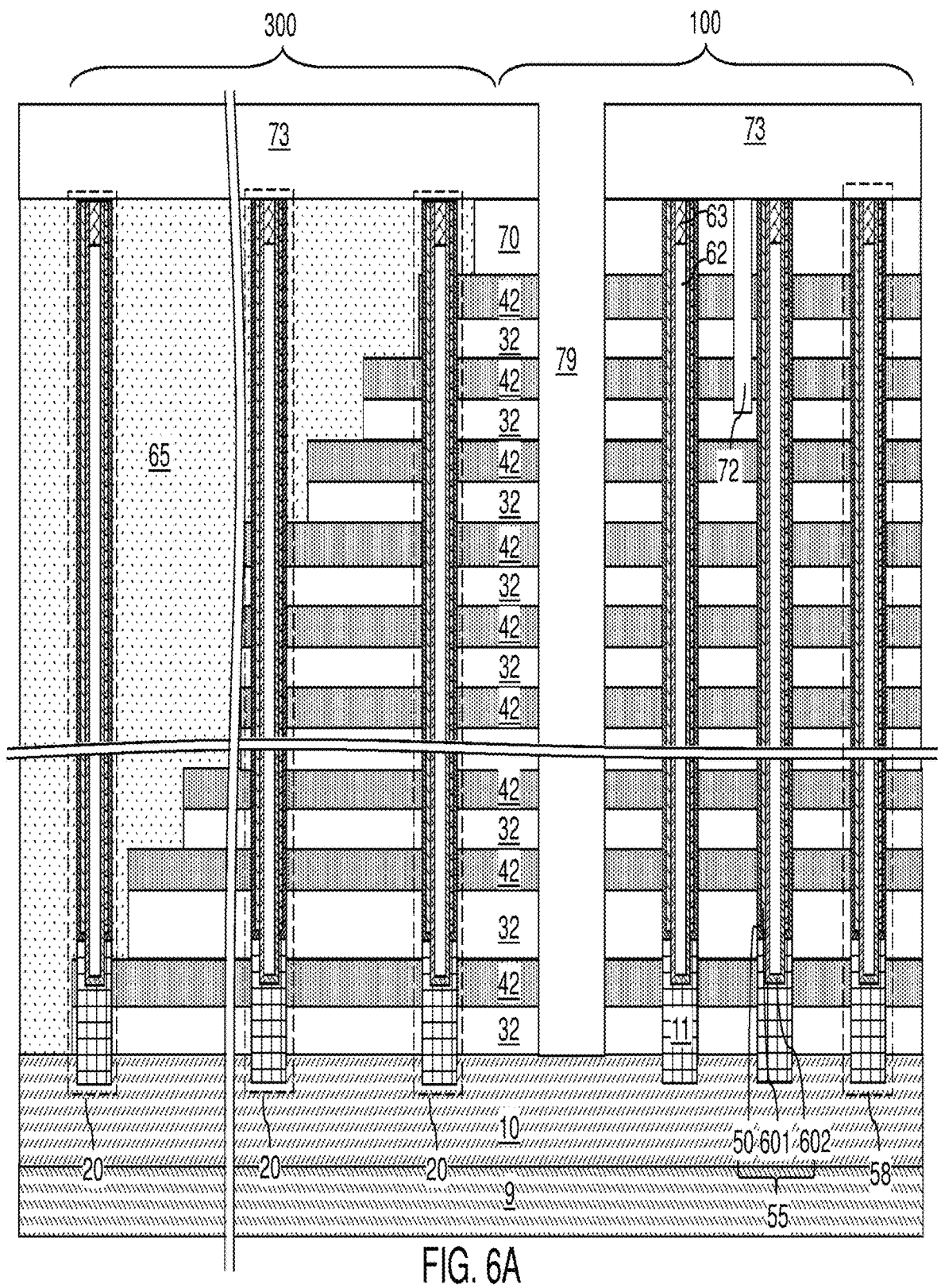
FIG. 6A is a schematic vertical cross-sectional view of the exemplary structure after formation of backside trenches according to an embodiment of the present disclosure.
Figure 6B:
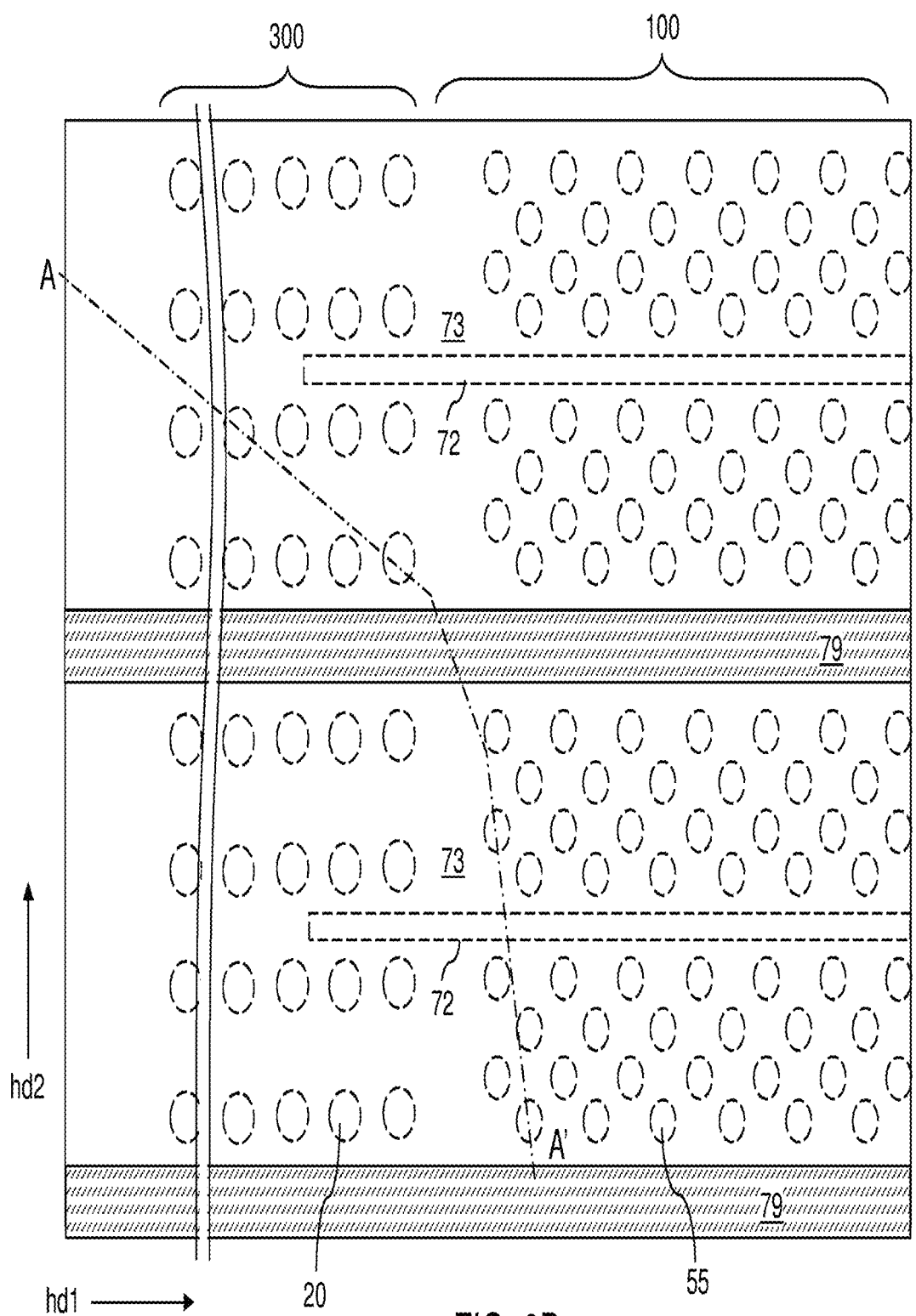
FIG. 6B is a partial see-through top-down view of the exemplary structure of FIG. 6A. The vertical plane A-A' is the plane of the schematic vertical cross-sectional view of FIG. 6A.

Referring to FIGS. 6A and 6B, a contact-level dielectric layer 73 can be formed over the alternating stack (32, 42) of insulating layer 32 and sacrificial material layers 42, and over the memory stack structures 55 and the support pillar structures 20. Contact via structures are subsequently formed through the contact-level dielectric layer 73. The contact-level dielectric layer 73 includes a dielectric material that is different from the dielectric material of the sacrificial material layers 42. For example, the contact-level dielectric layer 73 may include silicon oxide. The contact-level dielectric layer 73 may have a thickness in a range from 50 nm to 500 nm, although lesser and greater thicknesses may also be used.

A photoresist layer (not shown) can be applied over the contact-level dielectric layer 73, and is lithographically patterned to form openings in areas between clusters of memory stack structures 55. The pattern in the photoresist layer can be transferred through the contact-level dielectric layer 73, the alternating stack (32, 42) and/or the retro-stepped dielectric material portion 65 using an anisotropic etch to form backside trenches 79, which vertically extend from the top surface of the contact-level dielectric layer 73 at least to the top surface of the substrate (9, 10), and laterally extend through the memory array region 100 and the staircase region 300.

In one embodiment, the backside trenches 79 may laterally extend along a first horizontal direction hd1 and can be laterally spaced apart one from another along a second horizontal direction hd2 that is perpendicular to the first horizontal direction hd1. The memory stack structures 55 can be arranged in rows that extend along the first horizontal direction hd1. The drain-select-level isolation structures 72 may laterally extend along the first horizontal direction hd1. Each backside trench 79 may have a uniform width that is invariant along the lengthwise direction (i.e., along the first horizontal direction hd1). Each drain-select-level isolation structure 72 may have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 may include a source contact opening in which a source contact structure can be subsequently formed. The photoresist layer can be removed, for example, by ashing.

Figure 7:
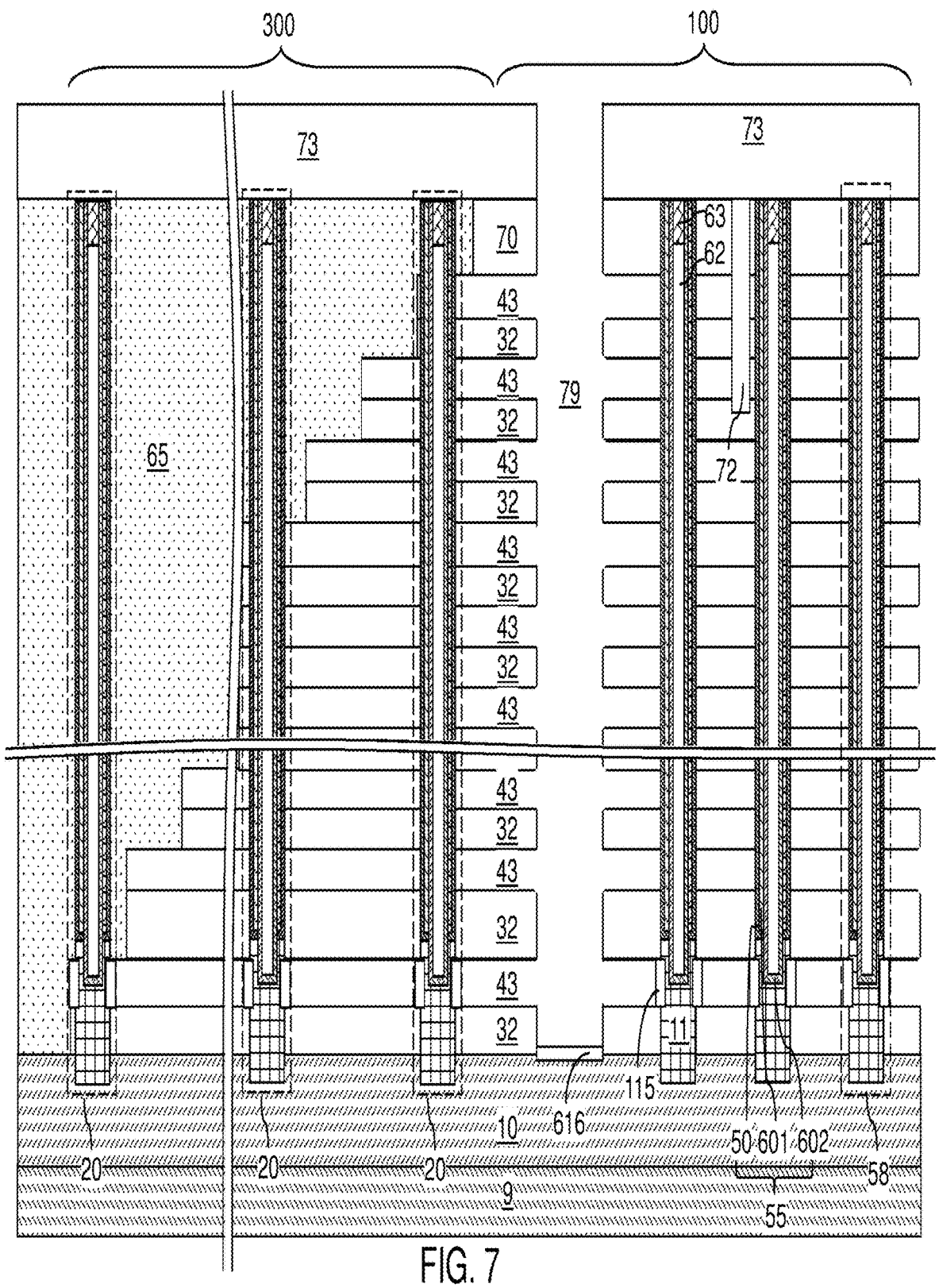
FIG. 7 is a schematic vertical cross-sectional view of the exemplary structure after formation of backside recesses according to an embodiment of the present disclosure.

Referring to FIGS. 7 and 8A, an etchant that selectively etches the second material of the sacrificial material layers 42 with respect to the first material of the insulating layers 32 can be introduced into the backside trenches 79, for example, using an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 may include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process using a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 may define a space for receiving a respective word line of the array of monolithic three-dimensional NAND strings.

Each of the plurality of backside recesses 43 may extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 may have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be used to convert a surface portion of each pedestal channel portion 11 into a tubular dielectric spacer 115, and to convert each physically exposed surface portion of the semiconductor material layer 10 into a planar dielectric portion 616. In one embodiment, each tubular dielectric spacer 115 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 115 include a dielectric material that includes the same semiconductor element as the pedestal channel portions 11 and additionally includes at least one non-metallic element such as oxygen and/or nitrogen such that the material of the tubular dielectric spacers 115 is a dielectric material. In one embodiment, the tubular dielectric spacers 115 may include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 may include a dielectric oxide, a dielectric nitride, or a dielectric oxynitride of the semiconductor material of the semiconductor material layer 10.

Referring to FIG. 8B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 115 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 may consist essentially of aluminum oxide. The thickness of the backside blocking dielectric layer 44 can be in a range from 1 nm to 15 nm, such as 2 to 6 nm, although lesser and greater thicknesses may also be used.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 may include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 8C, a metallic barrier layer 46A can be deposited in the backside recesses 43. The metallic barrier layer 46A includes an electrically conductive metallic material that may function as a diffusion barrier layer and/or adhesion promotion layer for a metallic fill material to be subsequently deposited. The metallic barrier layer 46A may include a conductive metallic nitride material such as TiN, TaN, WN, or a stack thereof, or may include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses may also be used. In one embodiment, the metallic barrier layer 46A may consist essentially of a conductive metal nitride such as TiN.

Figure 9:
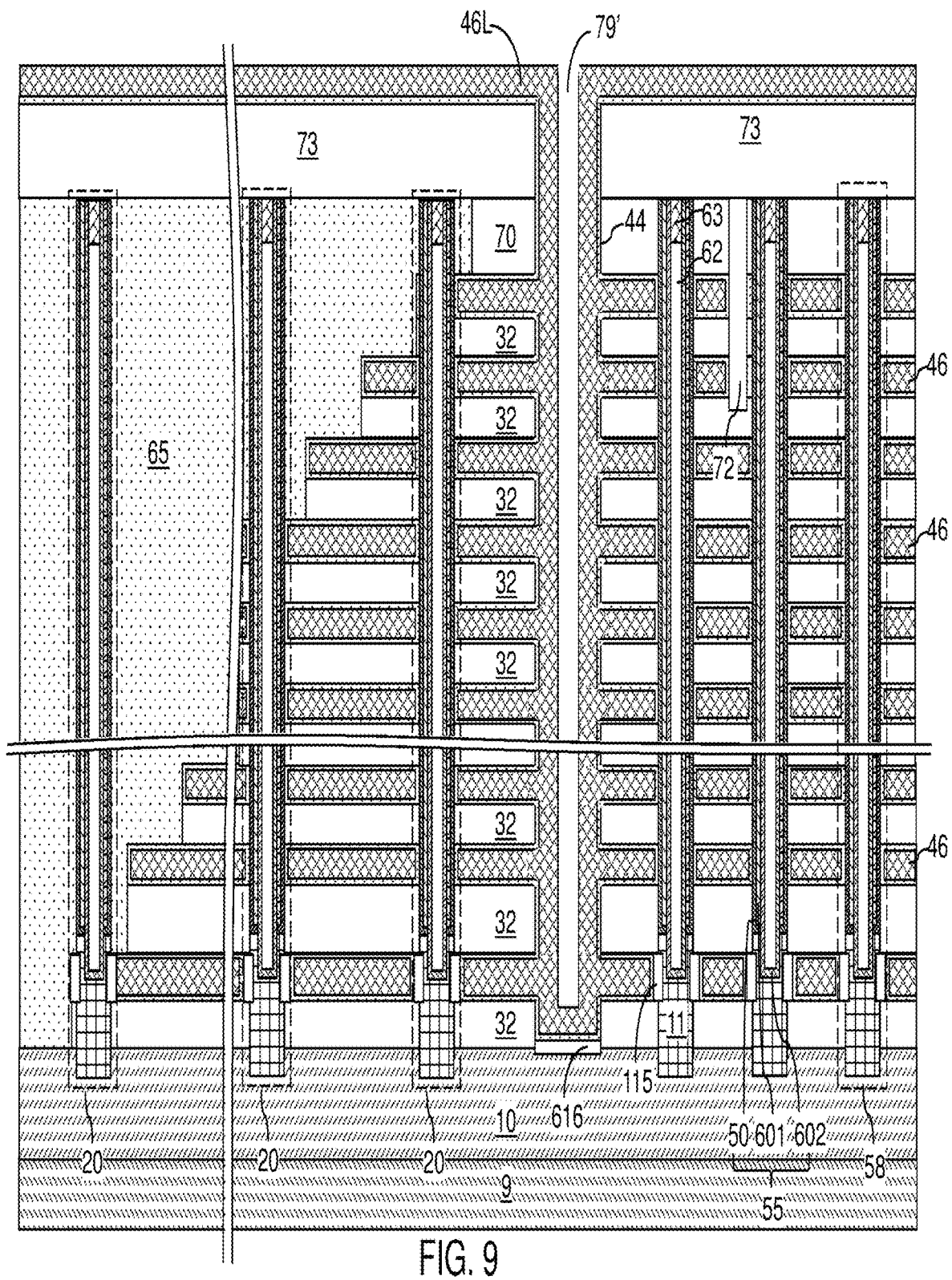
FIG. 9 is a schematic vertical cross-sectional view of the exemplary structure at the processing step of FIG. 8D.

Referring to FIGS. 8D and 9, a metal fill material is deposited in the plurality of backside recesses 43, on the sidewalls of the at least one backside trench 79, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B may consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B may consist essentially of a single elemental metal. In one embodiment, the metallic fill material layer 46B can be deposited using a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 115 laterally surrounds a pedestal channel portion 11. A bottommost electrically conductive layer 46 laterally surrounds each tubular dielectric spacer 115 upon formation of the electrically conductive layers 46.

Figure 10A:
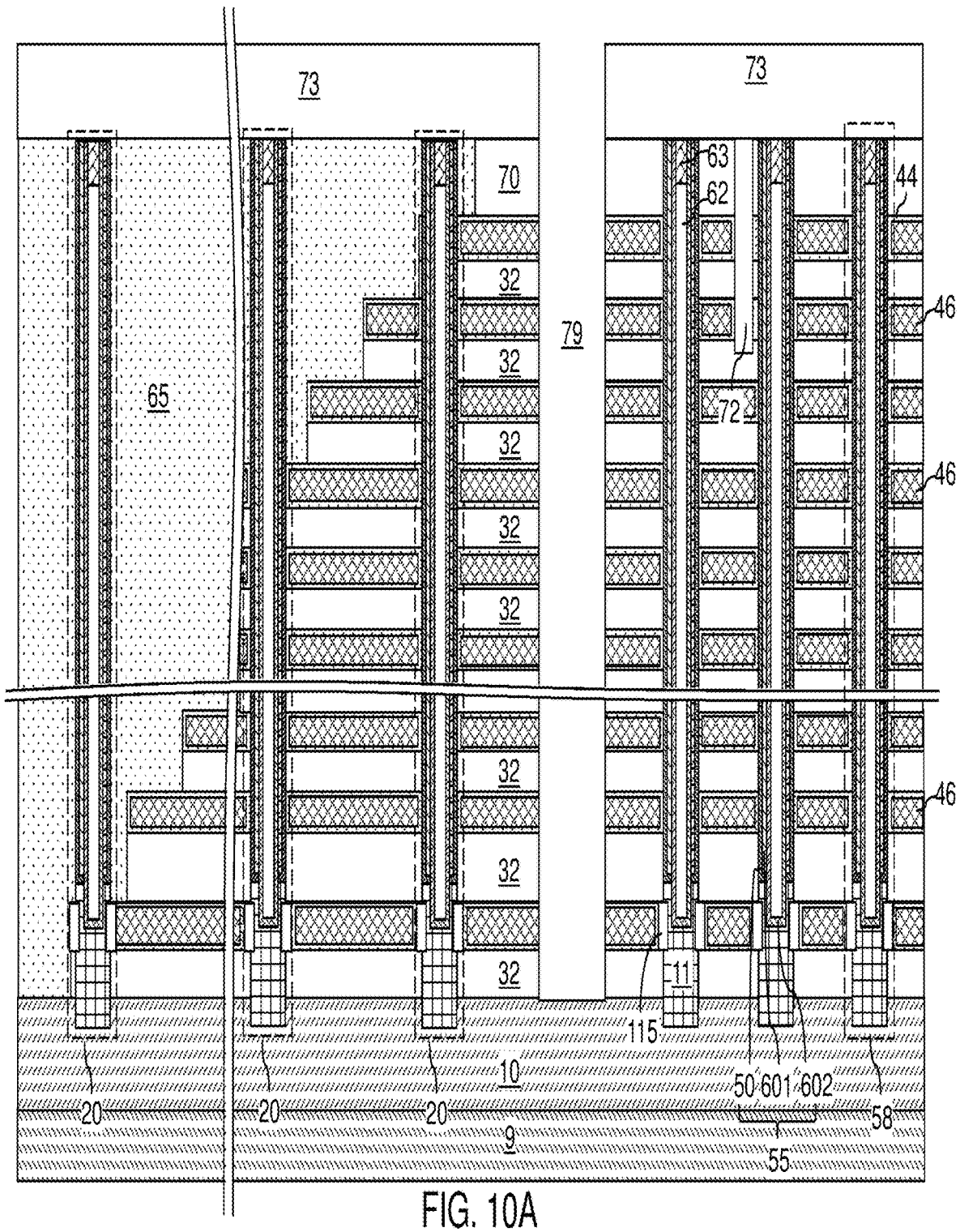
FIG. 10A is a schematic vertical cross-sectional view of the exemplary structure after removal of a deposited conductive material from within the backside trench according to an embodiment of the present disclosure.
Figure 10B:
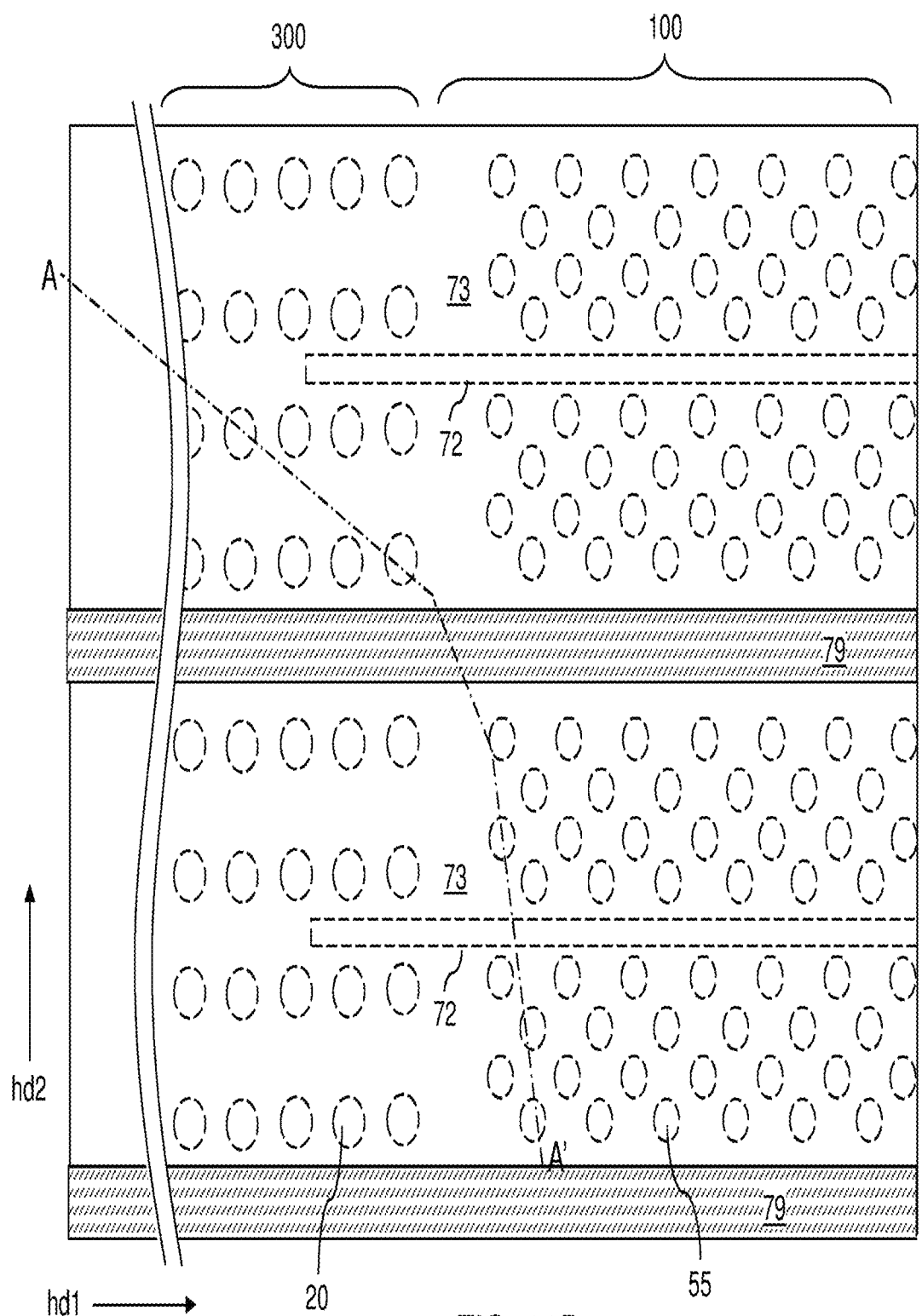
FIG. 10B is a top-down view of the exemplary structure of FIG. 10A.

Referring to FIGS. 10A and 10B, the deposited metallic material of the continuous electrically conductive material layer 46L is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 may function as a combination of a plurality of control gate electrodes located at a same level and a word line electrically interconnecting, i.e., electrically connecting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be used. The planar dielectric portions 616 can be removed during removal of the continuous electrically conductive material layer 46L. A backside cavity 79' is present within each backside trench 79.

Figure 11A:
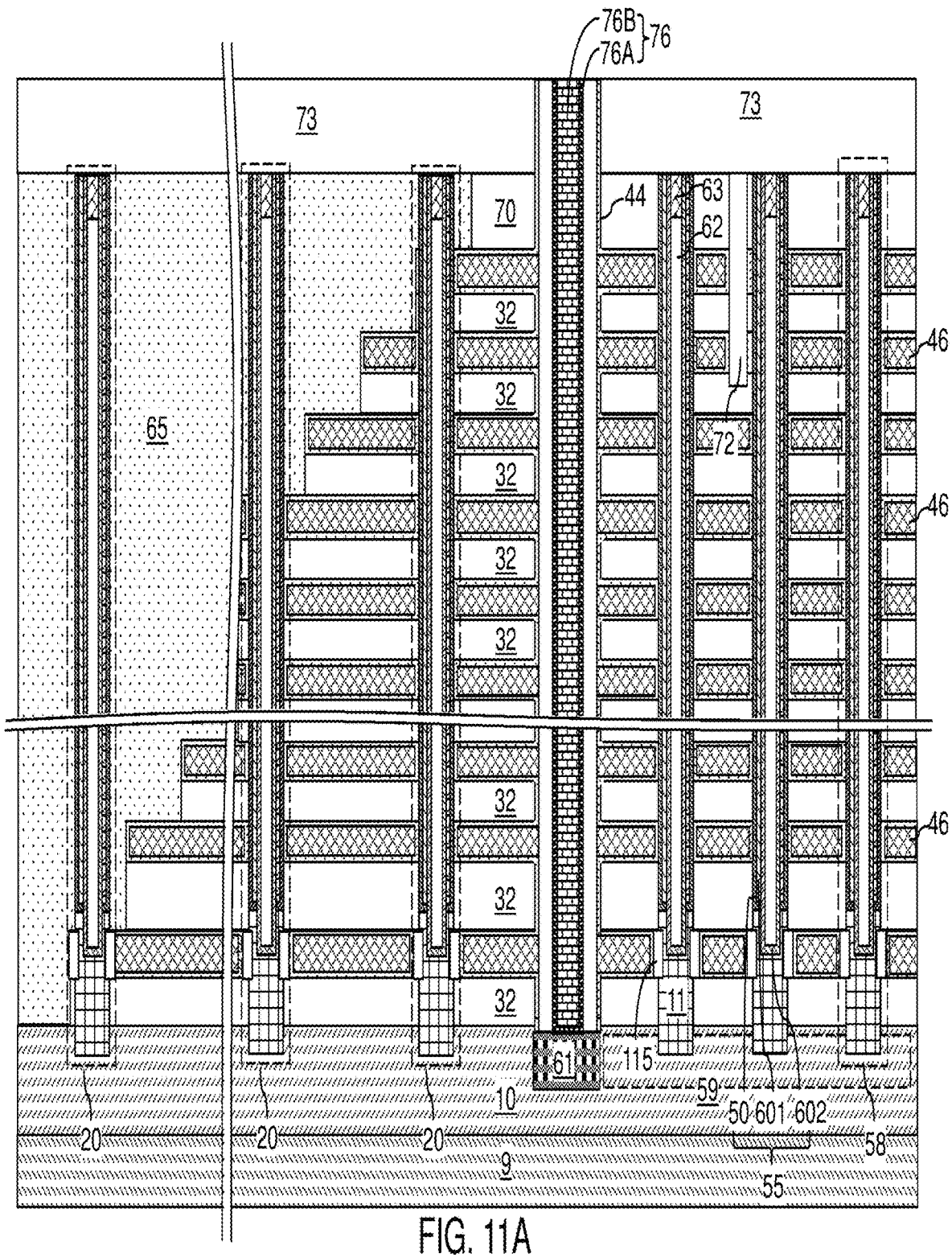
FIG. 11A is a schematic vertical cross-sectional view of the exemplary structure after formation of an insulating spacer and a source contact structure within each backside trench according to an embodiment of the present disclosure.
Figure 11B:
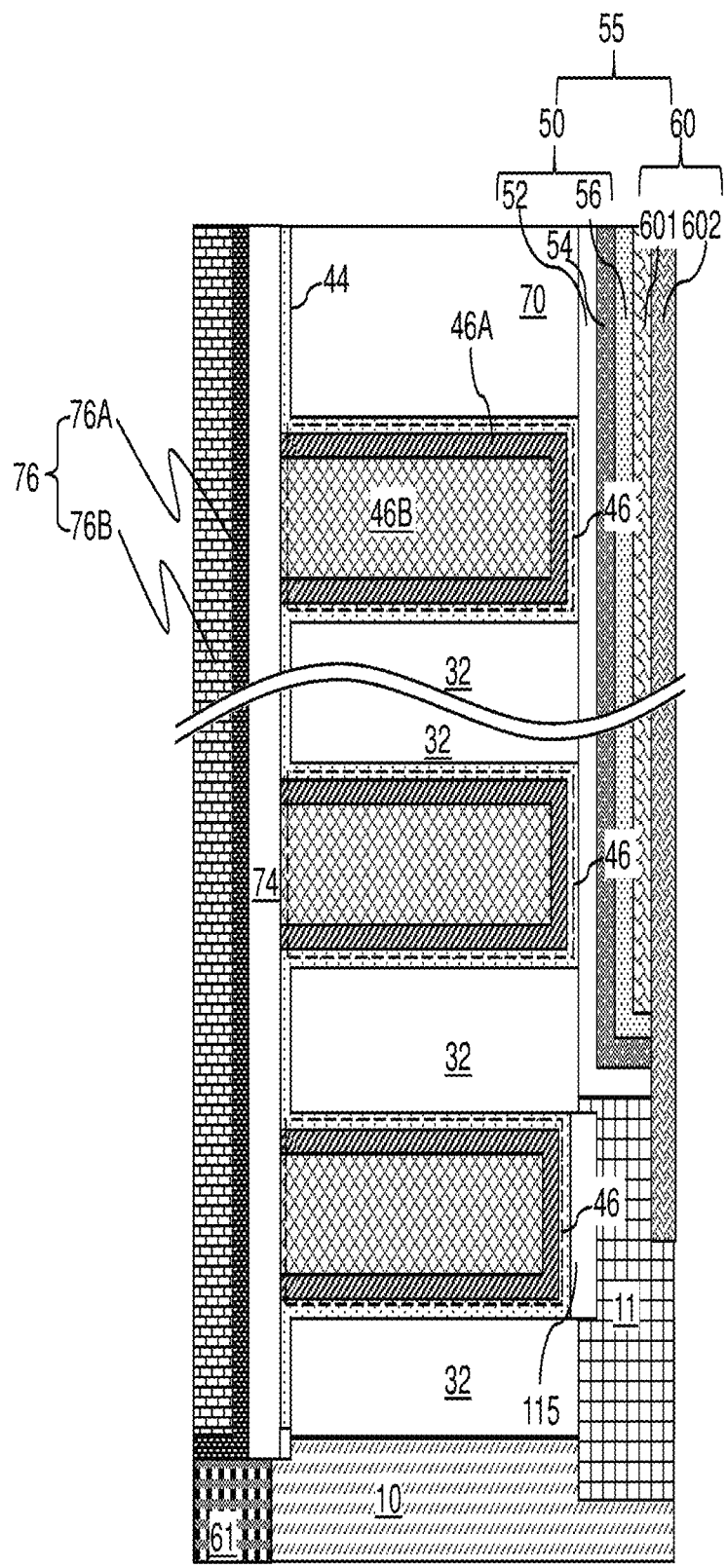
FIG. 11B is a magnified view of a region of the exemplary structure of FIG. 11A.

Referring to FIGS. 11A and 11B, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer may include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses may also be used.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not used, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 may have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) may comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A source contact via structure 76 can be formed within each backside cavity 79'. Each source contact via structure 76 may fill a respective backside cavity 79'. The source contact via structures 76 can be formed by depositing at least one conductive material in the remaining unfilled volume (i.e., the backside cavity 79') of the backside trench 79. For example, the at least one conductive material may include a conductive liner 76A and a conductive fill material portion 76B. The conductive liner 76A may include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses may also be used. The conductive fill material portion 76B may include a metal or a metallic alloy. For example, the conductive fill material portion 76B may include W, Cu, Al, Co, Ru, Ni, an alloy thereof, or a stack thereof.

The at least one conductive material can be planarized using the contact-level dielectric layer 73 overlying the alternating stack (32, 46) as a stopping layer. If chemical mechanical planarization (CMP) process is used, the contact-level dielectric layer 73 can be used as a CMP stopping layer. Each remaining continuous portion of the at least one conductive material in the backside trenches 79 constitutes a source contact via structure 76.

The source contact via structure 76 extends through the alternating stack (32, 46), and contacts a top surface of the source region 61. If a backside blocking dielectric layer 44 is used, the source contact via structure 76 may contact a sidewall of the backside blocking dielectric layer 44.

Figure 12A:
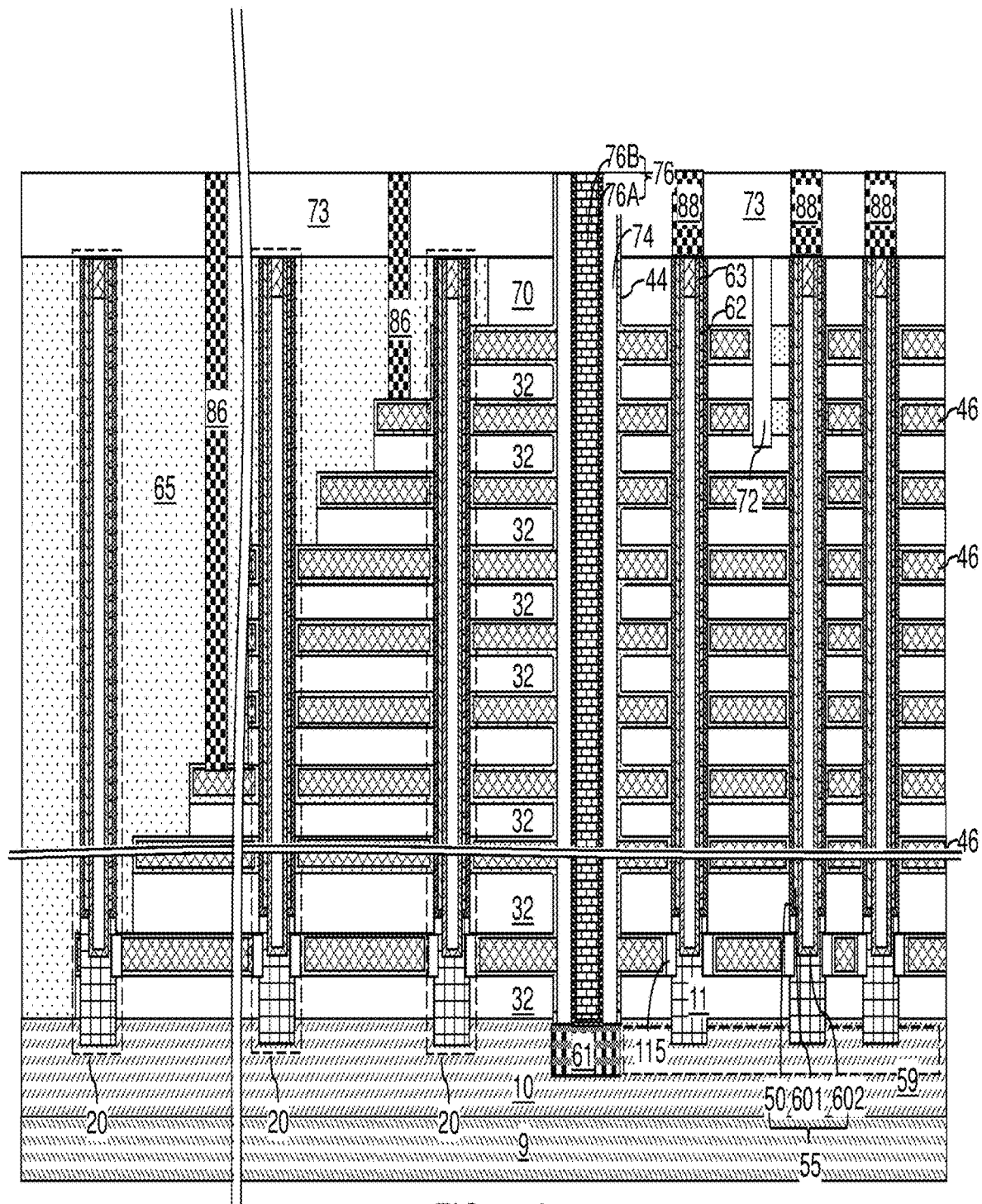
FIG. 12A is a schematic vertical cross-sectional view of the exemplary structure after formation of contact level dielectric material layers and contact via structures according to an embodiment of the present disclosure.
Figure 12B:
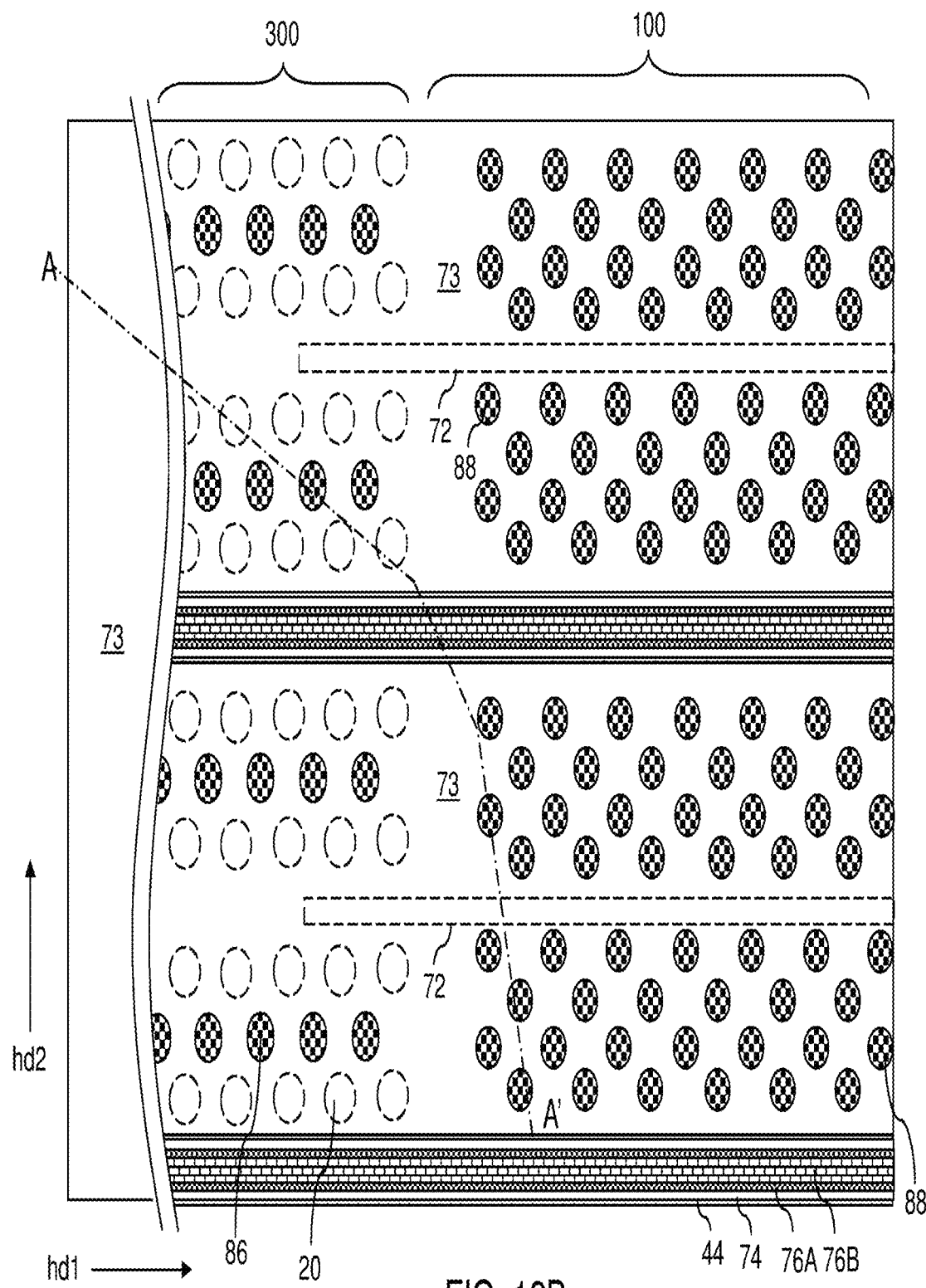
FIG. 12B is a top-down view of the exemplary structure of FIG. 12A. The vertical plane A-A' is the plane of the schematic vertical cross-sectional view of FIG. 12A.

Referring to FIGS. 12A and 12B, layer contact via structures 86 can be formed through the contact-level dielectric layer 73 and the retro-stepped dielectric material portion 65 to a top surface of a respective one of the electrically conductive layers 46 in the staircase region. The layer contact via structures 86 include word line contact via structures that contact a subset of the electrically conductive layers 46 that functions as word lines. In one embodiment, top surfaces of the layer contact via structures 86 can be coplanar with the top surface of the contact-level dielectric layer 73.

Further, drain contact via structures 88 can be formed on a respective one of the drain regions 63. The drain contact via structures 88 extend through the contact-level dielectric layer 73, and contact a top surface of a respective one of the drain regions 63. Each drain contact via structure 88 may have a cylindrical shape, i.e., a shape having horizontal cross-sectional area that is invariant with translation along the vertical direction.

Figure 13A:
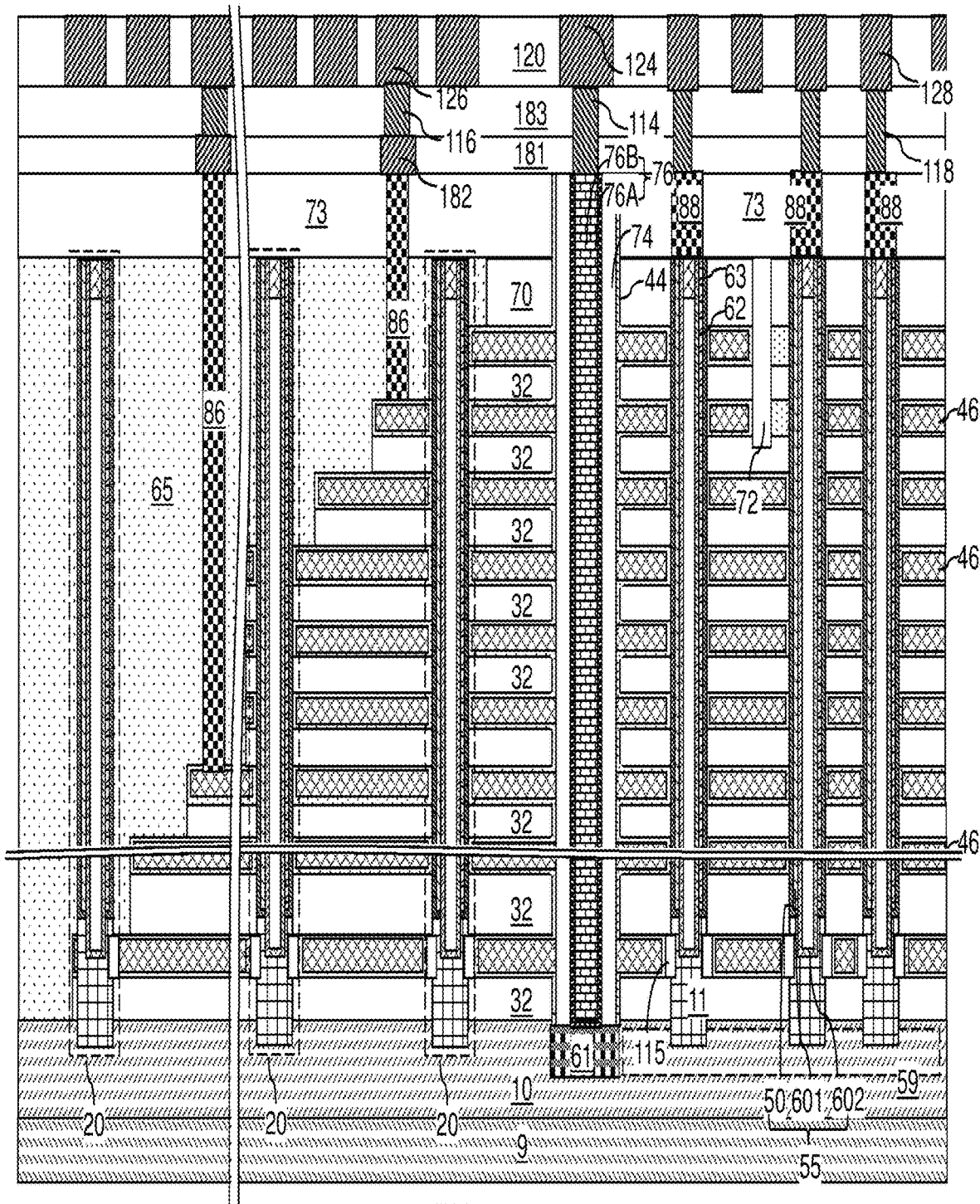
FIG. 13A is a schematic vertical cross-sectional view of the exemplary structure after formation of first-level dielectric material layers and first-level metal interconnect structures according to an embodiment of the present disclosure.
Figure 13B:
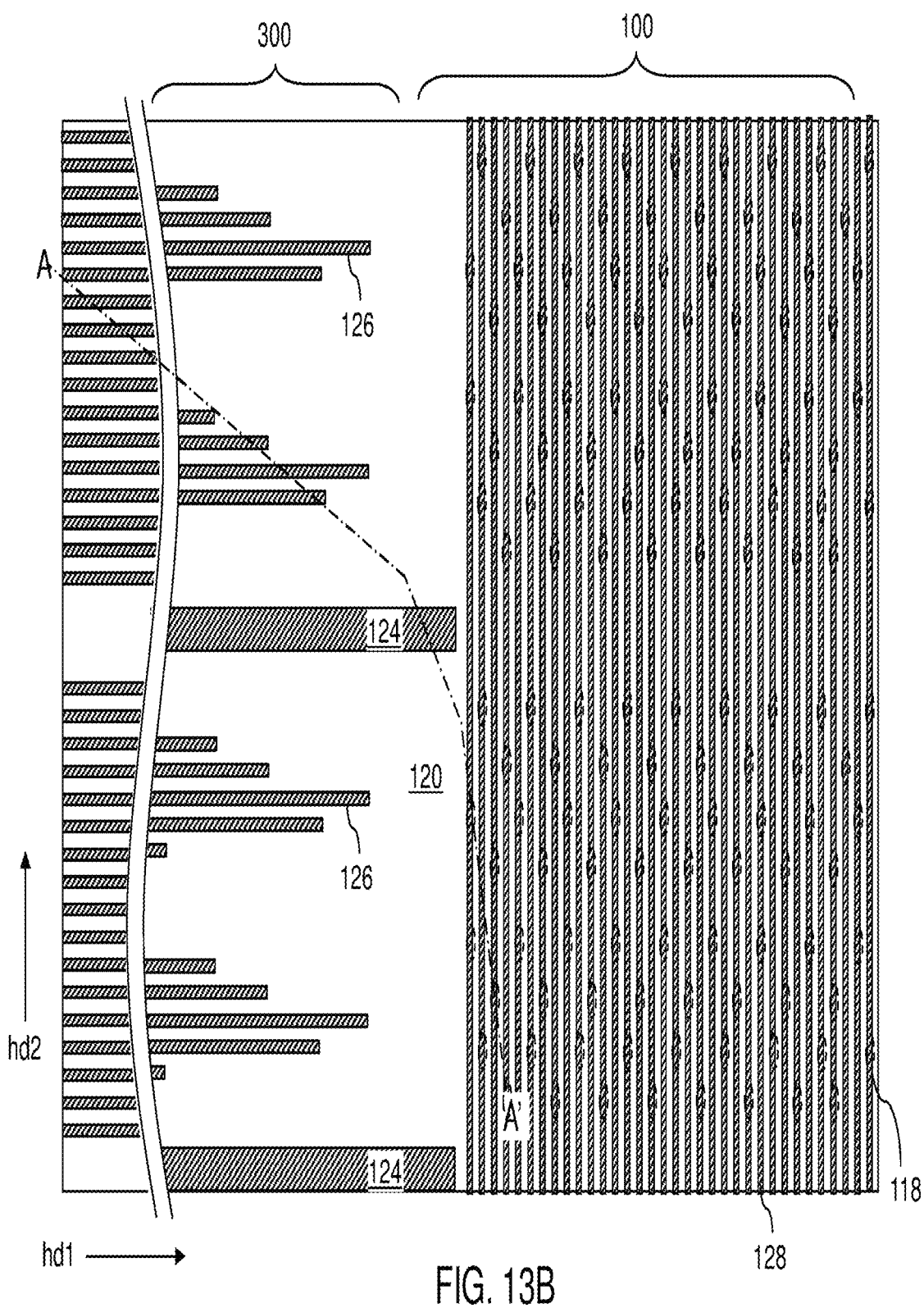
FIG. 13B is a top-down view of the exemplary structure of FIG. 13A. The vertical plane A-A' is the plane of the schematic vertical cross-sectional view of FIG. 13A.

Referring to FIGS. 13A and 13B, a base-line-level dielectric layer 181 can be deposited over the contact-level dielectric layer 73. Base-level metal lines, i.e., bottommost metal lines, are subsequently formed through the base-line-level dielectric layer 181. The base-line-level dielectric layer 181 includes a dielectric material such as silicon oxide. Line trenches can be formed through the base-line-level dielectric layer 181 over the layer contact via structures 86. The line trenches in the base-line-level dielectric layer 181 can be filled with at least one conductive material to form base-level metal lines 182 that contact a top surface of a respective underlying one of the layer contact via structures 181.

Alternatively, the base-line-level dielectric layer 181 can be formed over the contact-level dielectric layer 73 prior to formation of the layer contact via structures 86, and integrated line and via cavities can be formed through the base-line-level dielectric layer 181, the contact-level dielectric layer 73, and the retro-stepped dielectric material portion 65. Each integrated line and via cavity may include a combined volume for a layer contact via structure 86 and a base-level metal line 182. The integrated line and via cavities are filled with at least one conductive material to form integrated line and via structures. Each integrated line and via structure may include a combination of a layer contact via structure 86 and a base-level metal line 182.

A connection-via-level dielectric layer 183 can be formed over the base-line-level dielectric layer 181. Connection via structures are subsequently formed through the connection-via-level dielectric layer 183. The connection-via-level dielectric layer 183 includes a dielectric material such as silicon oxide. Connection via cavities extending through the connection-via-level dielectric layer 183 and optionally extending through the base-line-level dielectric layer 181 can be formed, for example, by application and patterning of a photoresist layer (not shown) over the connection-via-level dielectric layer 183, and by an anisotropic etch process that transfers the pattern in the photoresist layer through underlying portions of the connection-via-level dielectric layer 183 and optionally through the base-line-level dielectric layer 181. The connection via cavities can be formed over the base-level metal line 182, the drain contact via structures 88, and the source contact via structures 76, which may function as etch stop structures during formation of the connection via cavities. The photoresist layer can be removed, for example, by ashing.

At least one conductive material can be deposited in the connection via cavities, and excess portions of the at least one conductive material can be removed from above the horizontal plane including the top surface of the connection-via-level dielectric layer 183 by a planarization process such as a recess etch or chemical mechanical planarization.

Various connection via structures (116, 114, 118) can be formed through the connection-via-level dielectric layer 183 and optionally through the base-line-level dielectric layer 181. The connection via structures (116, 114, 118) can include, for example, word-line-connection via structures 116 contacting a respective one of the base-level metal line 182 and connected to a respective word line contact via structure and an electrically conductive layer, source-connection via structures 114 contacting a respective one of the source contact via structures 76, and bit-line-connection via structures 118 contacting a respective one of the drain contact via structures 88. The bit-line-connection via structures 118 can be elongated along the direction of bit lines to be subsequently formed, which can be the second horizontal direction hd2.

A first line-level dielectric layer 120 can be deposited over the connection-via-level dielectric layer 183. First-level metal line structures are subsequently formed in the first line-level dielectric layer 120. The first line-level dielectric layer 120 includes a dielectric material such as silicon oxide, and can have a thickness in a range from 100 nm to 400 nm, although lesser and greater thicknesses can also be used. Line trenches can be formed through the first line-level dielectric layer 120 over the connection via structures (116, 114, 118). The line trenches in the first line-level dielectric layer 120 can be filled with at least one conductive material to form first-level metal line structures (124, 126, 128) that contact a top surface of a respective underlying one of the connection via structures (116, 114, 118). The first-level metal line structures (124, 126, 128) can include first word-line-interconnect metal lines 126 contacting a respective one of the word-line-connection via structures 116, first source-interconnect metal lines 124 contacting a respective one of the source-connection via structures 114, and bit lines 128 contacting a respective one of the bit-line-connection via structures 118

Alternatively, the first line-level dielectric layer 120 can be formed over the connection-via-level dielectric layer 183 prior to formation of the connection via structures (116, 114, 118), and integrated line and via cavities can be formed through the first line-level dielectric layer 120 and the connection-via-level dielectric layer 183. Each integrated line and via cavity may include a combined volume for an adjoining pair of a first-level metal line structure (124, 126, 128) and a connection via structure (116, 114, 118). The integrated line and via cavities are filled with at least one conductive material to form integrated line and via structures. Each integrated line and via structure may include a combination of a first-level metal line structure (124, 126, 128) and a connection via structure (116, 114, 118).

In one embodiment, the bit lines 128 may laterally extend along the second horizontal direction (e.g., bit line direction) hd2, and can be laterally spaced apart along the first horizontal direction (e.g., word line direction) hd1 with a uniform pitch, which is herein referred to as a bit line pitch. The first source-interconnect metal lines 124 and the first word-line-interconnect metal lines 126 may laterally extend along the first horizontal direction hd1, and can be formed in the staircase region 300. Each source region 61 can be electrically connected to a respective set of at least one first source-interconnect metal line 124 through a respective source contact via structure 76 and a respective at least one source-connection via structure 114.

Figure 14A:
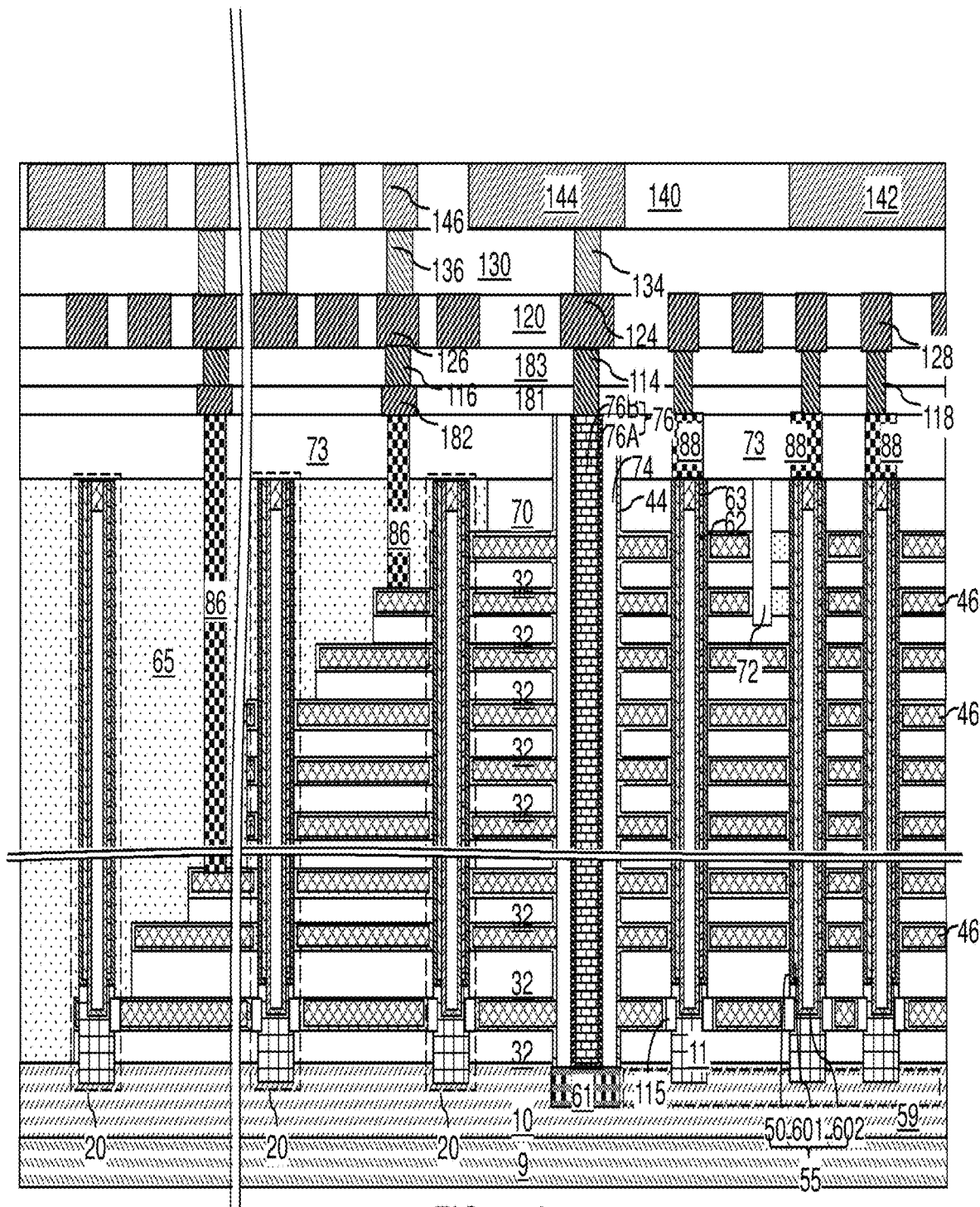
FIG. 14A is a schematic vertical cross-sectional view of the exemplary structure after formation of memory-side bonding pads according to an embodiment of the present disclosure.
Figure 14B:
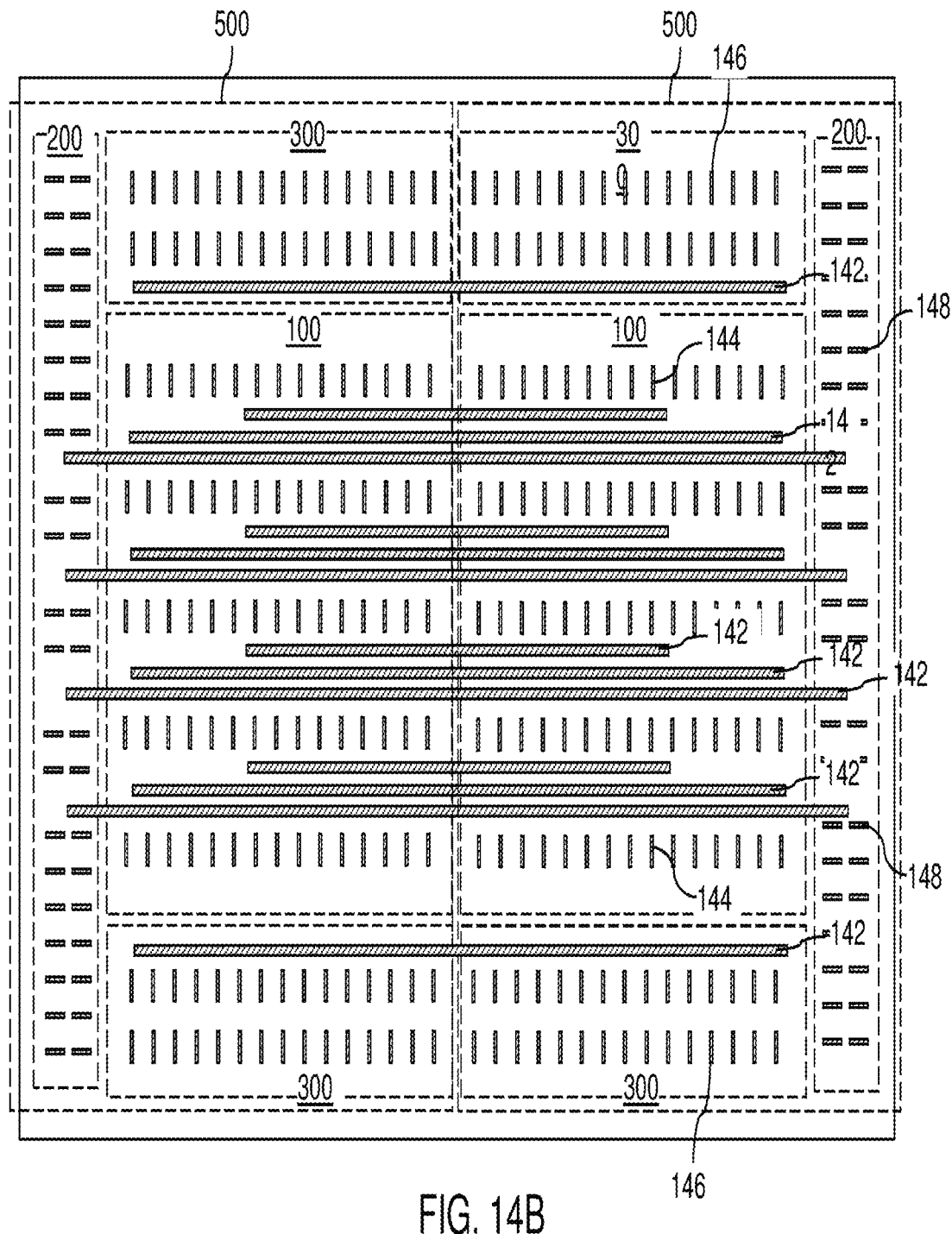
FIG. 14B is a top-down view of an in-process memory die including the exemplary structure of FIG. 14A.

Referring to FIGS. 14A and 14B, a first via-level dielectric layer 130 can be deposited over the first line-level dielectric layer 120. The first via-level dielectric layer 130 includes a dielectric material such as undoped silicate glass, a doped silicate glass, or an organosilicate glass. The thickness of the first via-level dielectric layer 130 can be in a range from 50 nm to 300 nm, although lesser and greater thicknesses may also be used.

Via cavities are formed through the first via-level dielectric layer 130, for example, by applying and patterning of a photoresist layer (not shown) over the first via-level dielectric layer 130 and by anisotropically etching unmasked portions of the first via-level dielectric layer 130. The photoresist layer can be subsequently removed. At least one conductive material can be deposited in the via cavities to form first metal via structures (134, 136). The first metal via structures (134, 136) may include first source-interconnect via structures 134 that are formed on a respective one of the first source-interconnect metal lines 124, first word-line-interconnect via structures 136 that are formed on a respective one of the first word-line-interconnect metal lines 126, and first bit-line-interconnect via structures (not shown) that are formed on a top surface of a respective one of the bit lines 128.

A second line-level dielectric layer 140 can be deposited over the first via-level dielectric layer 130. The second line-level dielectric layer 140 includes a dielectric material such as undoped silicate glass, a doped silicate glass, or an organosilicate glass. The thickness of the second line-level dielectric layer 140 can be in a range from 50 nm to 300 nm, although lesser and greater thicknesses may also be used.

Line cavities are formed through the second line-level dielectric layer 140, for example, by application and patterning of a photoresist layer (not shown) over the second line-level dielectric layer 140 and by anisotropically etching unmasked portions of the second line-level dielectric layer 140. The photoresist layer can be subsequently removed. A conductive material can be deposited in the line cavities to form various second-level metal line structures (142, 148, 144, 146). The second-level metal line structures (142, 148, 144, 146) may include bit-line-interconnect metal lines 148 that are formed on a top surface of a respective one of the first bit-line-interconnect via structures, second source-interconnect metal lines 144 that are formed on a top surface of a respective one of the first source-interconnect via structures 134, and second word-line-interconnect metal lines 146 that are formed on a top surface of a respective one of the first word-line-interconnect via structures 136.

In one embodiment, the bit-line-interconnect metal lines 148 may be formed in a respective peripheral region 200, which can be located adjacent to a memory array region 100 and a staircase region 300. The second source-interconnect metal lines 144 can be formed throughout memory array regions 100 to facilitate distribution of a source bias voltage throughout each memory array region 100. The second word-line-interconnect metal lines 146 can be formed in the staircase regions 300.

The second-level metal line structures (142, 148, 144, 146) can include interconnects, e.g., metal lines, that are used to provide an electrically conductive connection between semiconductor devices within a support die to be subsequently bonded to the memory die incorporating the exemplary structure. The semiconductor devices in the support die 700 include peripheral devices 710, such as transistors (e.g., CMOS configuration transistors) that are configured to control operation of the memory elements within the memory die. The metal lines can be used to provide electrically conductive signal paths between various nodes of the peripheral devices of the support die. Such interconnects (e.g., metal lines) are herein referred to as peripheral-signal-path metal lines 142, which can be a subset of the second-level metal line structures (142, 148, 144, 146). Thus, the peripheral-signal-path metal lines 142 provide signal paths through the memory die 900 between the peripheral devices 710 in a support die 700 to be subsequently bonded to the memory die 900 that incorporate the exemplary structure.

In one embodiment, a memory die that that incorporates the exemplary structure can include a plurality of planes, i.e., an assembly of devices that is capable of independently executing an external command without being limited by operational status of any external device. In one embodiment, a combination of a memory array region 100, at least one staircase region 300, and a peripheral region 200 constitutes a plane 500. A memory die can include a plurality of planes 500. In one embodiment, a subset of the peripheral-signal-path metal lines 142 can continuously extend between two planes 500 over the memory devices and the bit lines 128. Additionally or alternatively, a subset of the peripheral-signal-path metal lines 142 can be confined within a plane 500 over the memory devices and the bit lines 128. The peripheral-signal-path metal lines 142 can extend between a pair of memory array regions 100 located within different planes 500, between a pair of staircase regions 300 located within different planes 500, between a pair of peripheral regions 200 located within different planes 500, and/or between any one of a memory array region 100, a staircase region 300, and a peripheral region 200 of a first plane 500 and any one of memory array region 100, a staircase region 300, and a peripheral region 200 of a second plane 500.

Figure 15A:
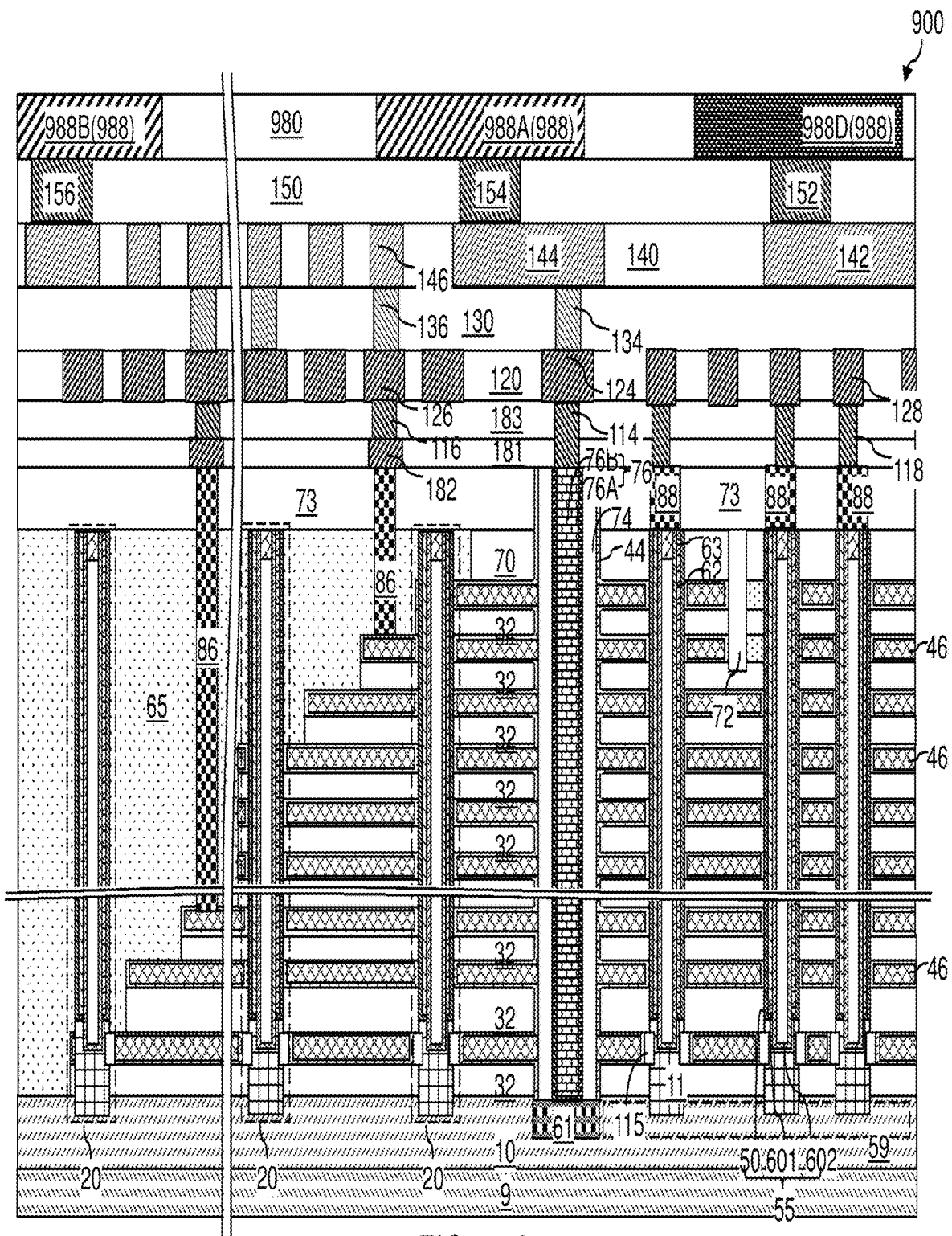
FIG. 15A is a schematic vertical cross-sectional view of the exemplary structure after formation of pad connection via structures and memory-die bonding pads according to an embodiment of the present disclosure.
Figure 15B:
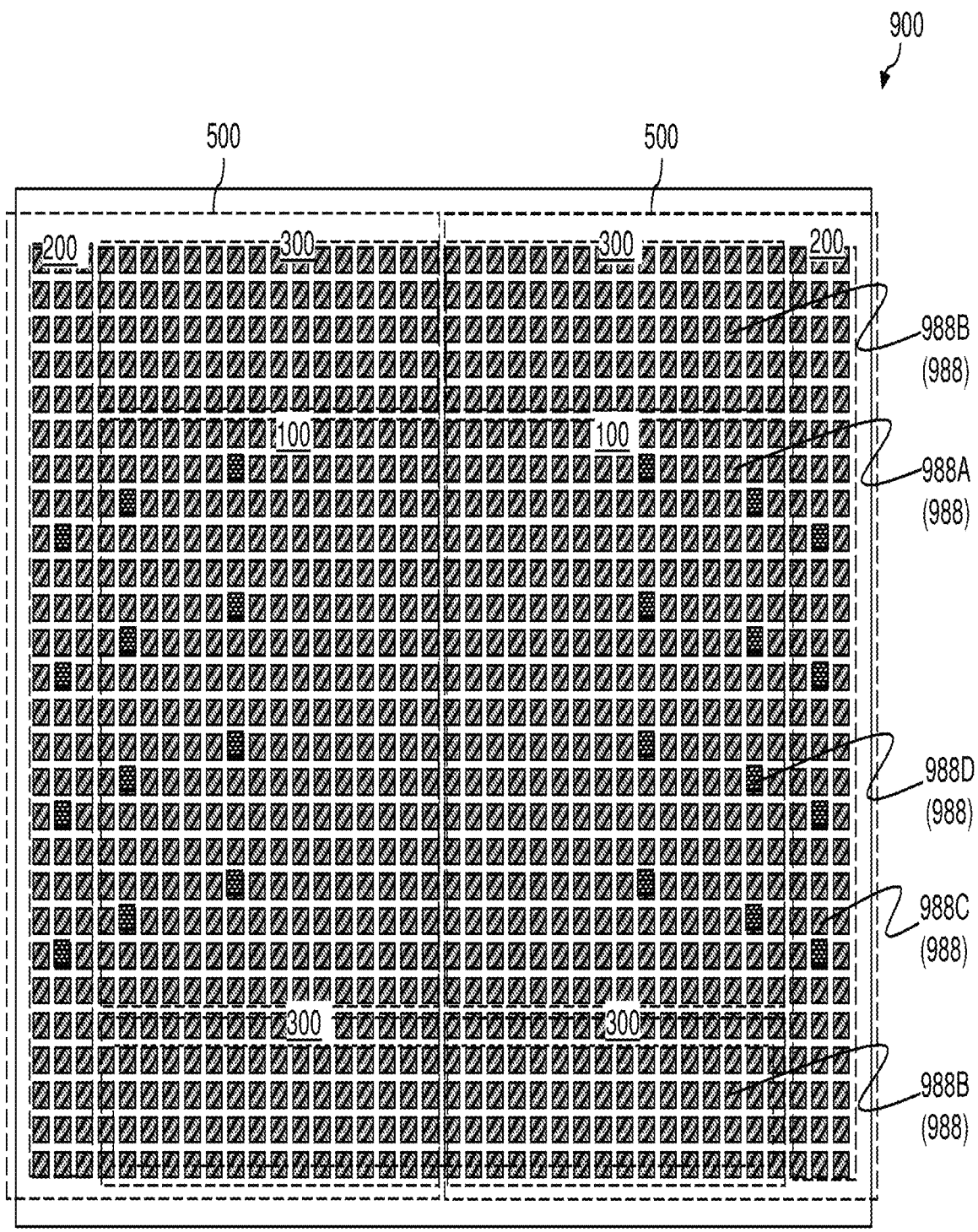
FIG. 15B is a top-down view of a memory die including the exemplary structure of FIG. 15A.

Referring to FIGS. 15A and 15B, a second via-level dielectric layer 150 can be deposited over the second line-level dielectric layer 140. The second via-level dielectric layer 150 includes a dielectric material such as undoped silicate glass, a doped silicate glass, or an organosilicate glass. The thickness of the second via-level dielectric layer 150 can be in a range from 50 nm to 300 nm, although lesser and greater thicknesses may also be used.

Via cavities are formed through the second via-level dielectric layer 150, for example, by applying and patterning of a photoresist layer (not shown) over the second via-level dielectric layer 150 and by anisotropically etching unmasked portions of the second via-level dielectric layer 150. The photoresist layer can be subsequently removed. At least one conductive material can be deposited in the via cavities to form second metal via structures (152, 154, 156). The second metal via structures (152, 154, 156) may include second source-interconnect via structures 154 that are formed on a respective one of the second source-interconnect metal lines 144, second word-line-interconnect via structures 156 that are formed on a respective one of the second word-line-interconnect metal lines 146, and second bit-line-interconnect via structures (not shown) that are formed on a top surface of a respective one of the bit-line-interconnect metal lines 148. Further, the second metal via structures (152, 154, 156) can include metal via structures that contact a respective one of the peripheral-signal-path metal lines 142. Each metal via structure that contacts a peripheral-signal-path metal line 142 can be used as a component of a signal path for signals between nodes of the peripheral devices to be bonded to the memory die 900 including the exemplary structure, and is herein referred to as peripheral-signal-path metal via structure 152. In one embodiment, at least two peripheral-signal-path metal via structure 152 can be formed on a peripheral-signal-path metal line 142. The least two peripheral-signal-path metal via structure 152 contacting a same peripheral-signal-path metal line 142 can be formed in a pair of memory array regions 100 located within different planes 500, in a pair of staircase regions 300 located within different planes 500, in a pair of peripheral regions located within different planes 500, and/or in any one of a memory array region 100, a staircase region 300, and a peripheral region 200 of a first plane 500 and in any one of memory array region 100, a staircase region 300, and a peripheral region 200 of a second plane 500.

Optionally, at least one additional line-level dielectric layer including additional metal lines and/or at least one additional via-level dielectric layer including additional metal via structures can be formed over the second via-level dielectric layer 150. In this case, the additional metal lines and the additional metal via structures can provide electrical connection through the at least one additional line-level dielectric layer and/or the at least one additional via-level dielectric layer for each of the second metal via structures (152, 154, 156).

A memory-side pad-level dielectric layer 980 can be deposited over the second via-level dielectric layer 150 (and over any additional line-level dielectric layer and/or any additional via-level dielectric layer, if present). The memory-side pad-level dielectric layer 980 includes a dielectric material such as silicon nitride, undoped silicate glass, a doped silicate glass, and/or an organosilicate glass. The thickness of the memory-side pad-level dielectric layer 980 can be in a range from 50 nm to 300 nm, although lesser and greater thicknesses may also be used.

The set of all dielectric material layers that overlie the insulating cap layer 70 is collectively referred to as memory-die interconnect dielectric layers (73, 181, 183, 120, 130, 140, 150, 980). The memory-die interconnect dielectric layers (73, 181, 183, 120, 130, 140, 150, 980) can include the contact-level dielectric layer 73, the base-line-level dielectric layer 181, the connection-via-level dielectric layer 183, the first line-level dielectric layer 120, the first via-level dielectric layer 130, the second line-level dielectric layer 140, the second via-level dielectric layer 150, any additional line-level dielectric layer (if present), any additional via-level dielectric layer (if present), and the memory-side pad-level dielectric layer 980. The set of all metal line structures and all metal via structures embedded in the memory-die interconnect dielectric layers (73, 181, 183, 120, 130, 140, 150, 980) is herein referred to as memory-die metal interconnect structures.

Pad cavities are formed through the memory-side pad-level dielectric layer 980, for example, by application and patterning of a photoresist layer (not shown) over the memory-side pad-level dielectric layer 980 and by anisotropically etching unmasked portions of the memory-side pad-level dielectric layer 980. The photoresist layer can be subsequently removed.

A conductive material can be deposited in the pad cavities to form various memory-die bonding pads 988. The memory-die bonding pads 988 may include memory-die source-interconnect bonding pads 988A that are formed on a top surface of a respective one of the second source-interconnect via structures 154, memory-die word-line-interconnect bonding pads 988B that are formed on a top surface of a respective one of the second word-line-interconnect via structures 156, and memory-die bit-line-interconnect bonding pads 988C that are formed on a top surface of a respective one of the second bit-line-interconnect via structures. Further, the memory-die bonding pads 988 can include memory-die peripheral-signal-path bonding pads 988D each of which contacts, or is electrically connected to, a respective one of the peripheral-signal-path metal via structures 152. The memory-die peripheral-signal-path bonding pads 988D can be located in any of the memory array regions 100, staircase regions 300, and peripheral regions 200 over multiple planes 500.

Figure 16A:
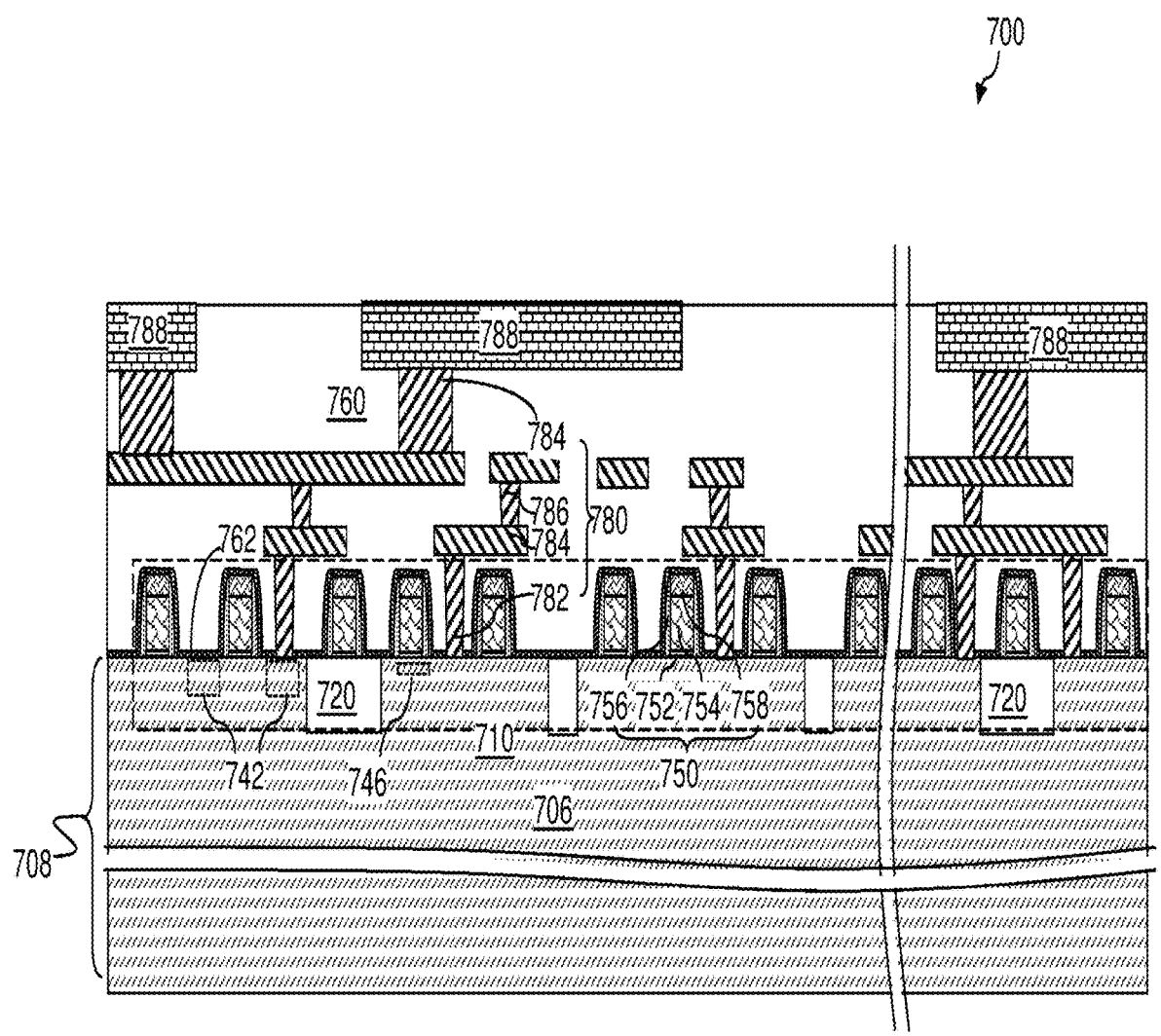
FIG. 16A is a vertical cross-sectional view of a region of a support die according to an embodiment of the present disclosure.
Figure 16B:
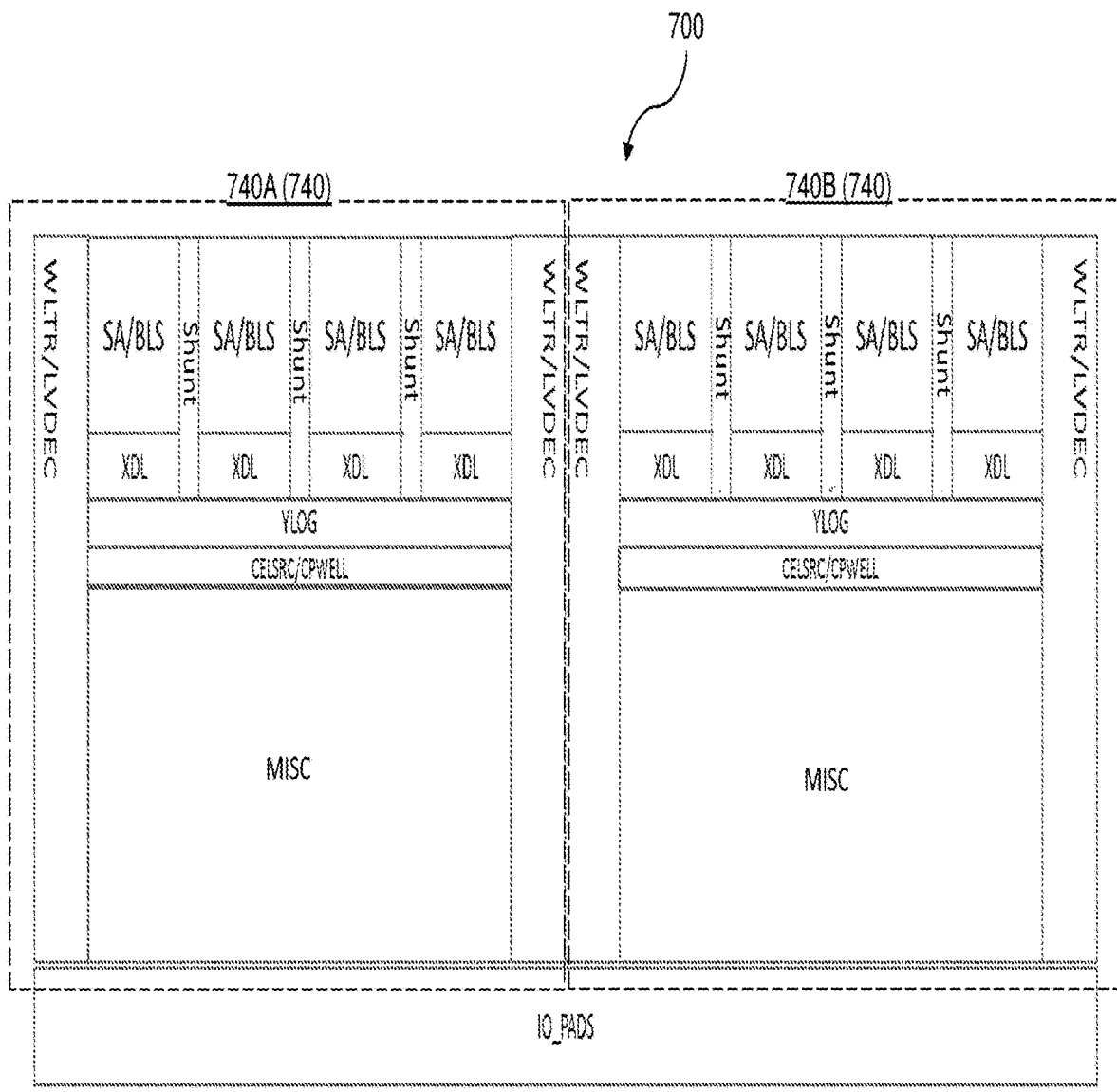
FIG. 16B is an exemplary layout of the support die of FIG. 16A.
Figure 16C:
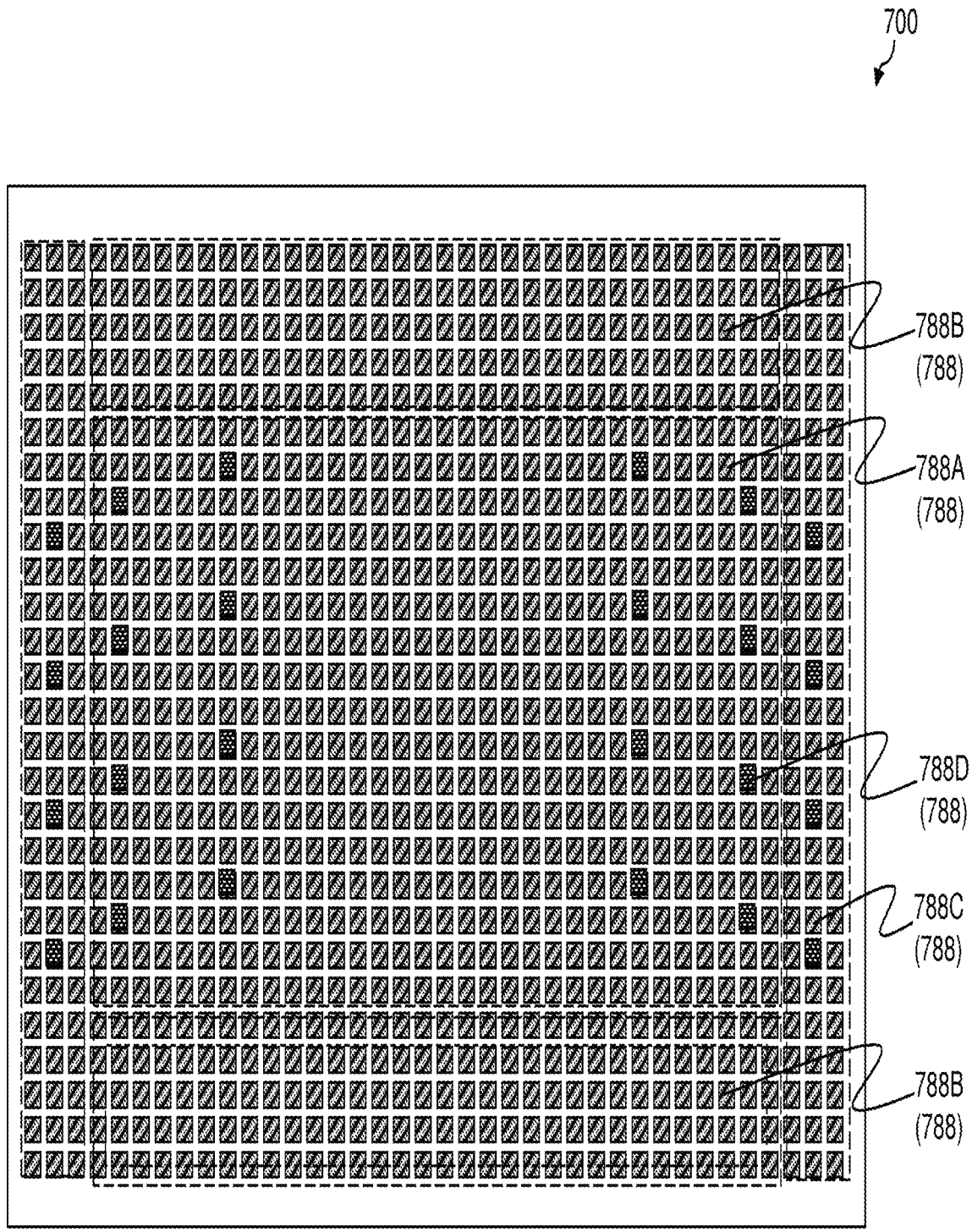
FIG. 16C is a top-down view of the support die of FIGS. 16A and 16B.

Referring to FIGS. 16A and 16B, a support die 700 including various semiconductor devices 710 is provided. The semiconductor devices 710 include at least one peripheral circuitry (i.e., driver circuits) 740 for operation of the three-dimensional array of memory elements in the memory die 900. Each peripheral circuitry 740 may include a word line driver that drives word lines (comprising the electrically conductive layers 46) of the three-dimensional memory array within the memory die 900, a bit line driver that drives the bit lines 128 in the memory die 900, a word line decoder circuit that decodes the addresses for the electrically conductive layers 46, a bit line decoder circuit that decodes the addresses for the bit lines 128, a sense amplifier circuit that senses the states of memory elements within the memory stack structures 55 in the memory die 900, a source power supply circuit that provides power to source regions 61 the memory die 900, a data buffer and/or latch, or any other semiconductor circuit that can be used to operate the array of memory stack structures 55 in the memory die 900.

In embodiments in which the memory die 900 includes a plurality of planes, the support die 700 can include a plurality of support circuitries 740, such as a first support circuitry 740A configured to drive a first plane 500 in the memory die 900 and a second support circuitry 740B configured to drive a second plane 500 in the memory die 900. FIG. 16B illustrates an example layout of peripheral circuitry 740 according to an embodiment. Each peripheral circuitry 740 can include driver circuits, including sense amplifier and bit line driver circuits (including bit line hook up/connection regions) located in areas labeled with "SA/BLS," and word line driver circuits (including word line X-direction decoder) located in areas labeled with "XDL." Each peripheral circuitry 740 can include column direction logic control circuits located in areas labeled with "YLOG." Each peripheral circuitry 740 can include source power supply circuits (e.g., source line bias voltage supply circuits) and doped well (e.g., when the semiconductor material layer 10 comprises p-well) bias voltage supply circuits located in areas labeled with "CELSRC/CPWELL." Each peripheral circuitry 740 can include electrical connections from the source power supply circuits located between SA/BLS in areas labeled with 'Shunt." Each peripheral circuitry 740 can include word line decoder circuits (e.g., word line control transistors and low voltage decoders) located in areas labeled with "WLTR/LVDEC," and other miscellaneous circuits located in areas labeled with "MISC." Each peripheral circuitry 740 can include input/output control circuits in areas labeled with "IO_PADS." The input/output control circuits can be used to receive external commands that can be simultaneously executed in the multiple planes 500 of the memory die 900, and to simultaneously or sequentially provide data output from the multiple planes 500 of the memory die 900.

The support die 700 may include a support-die substrate 708, which may include a support-die semiconductor layer 706. The support-die semiconductor layer 706 may include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

Shallow trench isolation structures 720 can be provided in a surface region of the support-die semiconductor layer 706 to provide electrical isolation from semiconductor devices of the peripheral circuitry 740. The various semiconductor devices 710 may include field effect transistors, which include respective transistor active regions 742 (i.e., source regions and drain regions), a channel 746, and a gate structure 750. The field effect transistors can be arranged in a CMOS configuration. Each gate structure 750 may include, for example, a gate dielectric 752, a gate electrode 754, a dielectric gate spacer 756 and a gate cap dielectric 758. For example, the semiconductor devices 710 may include word line drivers for electrically biasing word lines of the memory die 900, which comprise the electrically conductive layers 46, and source power supply field effect transistors that generate power to be supplied to the source regions 61 the memory die 900

Dielectric material layers are formed over the semiconductor devices 710, which are herein referred to as support-die dielectric layers 760. Optionally, a dielectric liner 762 (such as a silicon nitride liner) can be formed to apply mechanical stress to the various field effect transistors and/or to prevent diffusion of hydrogen or impurities from the support-die dielectric layers 760 into the semiconductor devices 710. Support-die metal interconnect structures 780 are formed within the support-die dielectric layers 760. The support-die metal interconnect structures 780 may include various device contact via structures 782 (e.g., source and drain electrodes which contact the respective source and drain nodes of the device or gate electrode contacts), interconnect-level metal line structures 784, interconnect-level metal via structures 786, and support-die bonding pads 788. The support-die bonding pads 788 are configured to mate with the memory-die bonding pads 988 to provide electrically conductive paths between the memory die 900 and the support die 700. The support-die bonding pads 788 can be arranged as a mirror image of the memory-die bonding pads 988.

The support-die bonding pads 788 may include support-die source-interconnect bonding pads 788A that are electrically connected to output nodes of the source power supply circuits of the support die 700, support-die word-line-interconnect bonding pads 788B that are electrically connected to output nodes of the word line driver circuits of the support die 700, and support-die bit-line-interconnect bonding pads 788C that are electrically connected to various nodes of the sense amplifier and bit line driver circuits. Further, the support-die bonding pads 788 can include support-die peripheral-signal-path bonding pads 788D that are electrically connected to a respective pair of signal nodes of the peripheral circuitry 740. The support-die peripheral-signal-path bonding pads 788D can be located in areas of each of the support circuitries 740. The support-die metal interconnect structures 780 can provide connecting signal paths between each support-die peripheral-signal-path bonding pad 788D and a respective node of the peripheral circuitries 740. Further, the support-die metal interconnect structures 780 may provide additional electrically conductive paths between a support-die peripheral-signal-path bonding pad 788D and any other type of support-die bonding pad 788, including the support-die source-interconnect bonding pads 788A, the support-die word-line-interconnect bonding pads 788B, and/or the support-die bit-line-interconnect bonding pads 788C.

Figure 17:
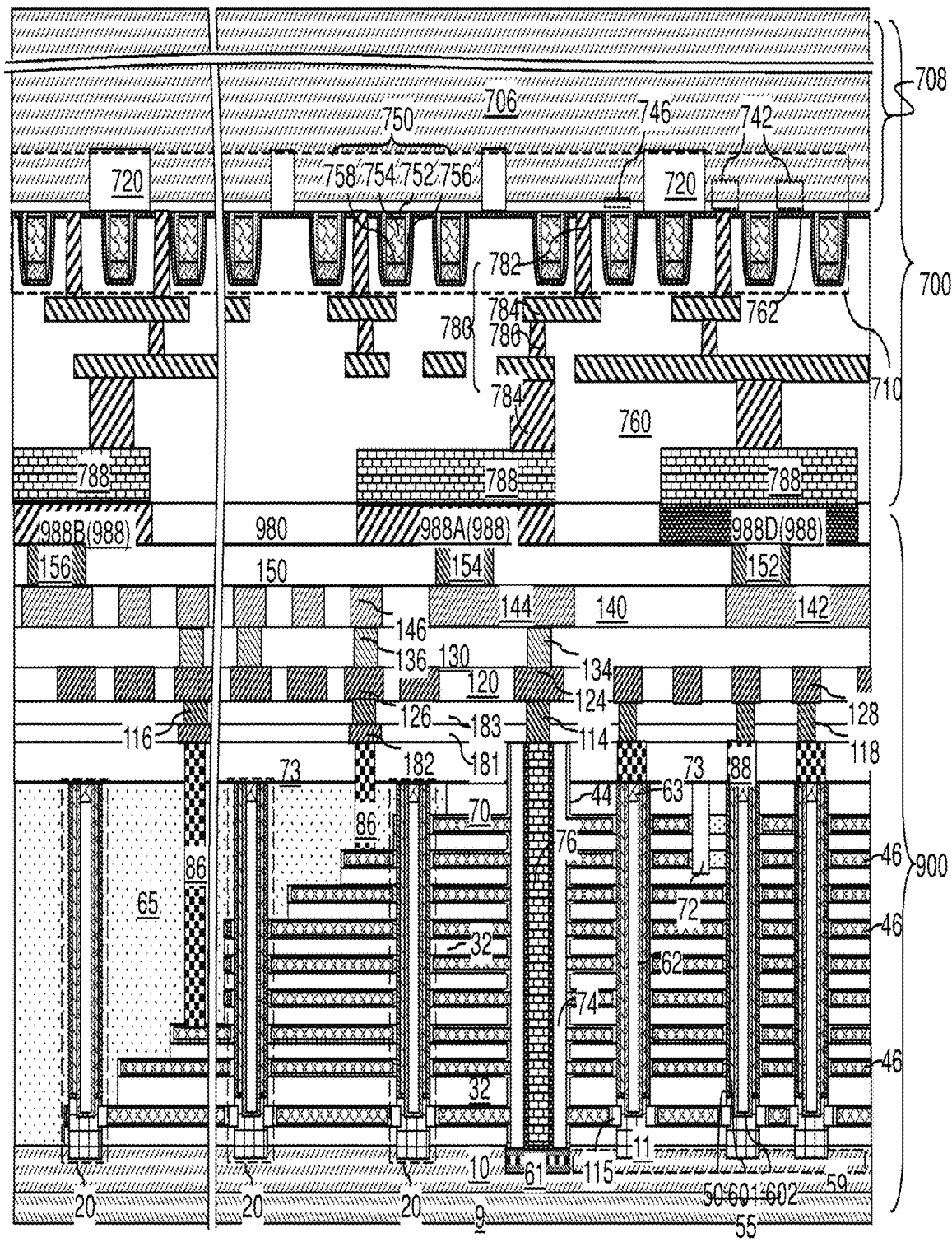
FIG. 17 is a vertical cross-sectional view of a three-dimensional memory device of the support die and a first memory die according to an embodiment of the present disclosure.

Referring to FIG. 17, a three-dimensional memory device in the form of a bonded assembly of the support die 700 and the memory die 900 can be formed. The memory-die bonding pads 988 of the memory die 900 can be bonded to the support-die bonding pads 788 of the support die 700 via metal-to-metal bonding or through an array of solder balls (not shown). Specifically, each support-die source-interconnect bonding pad 788A can be bonded to a respective one of the memory-die source-interconnect bonding pads 988A, each support-die word-line-interconnect bonding pad 788B can be bonded to a respective one of the memory-die word-line-interconnect bonding pads 988B, each support-die bit-line-interconnect bonding pad 788C can be bonded to a respective one of the memory-die bit-line-interconnect bonding pads 988C, and each support-die peripheral-signal-path bonding pad 788D can be bonded to a respective one of the memory-die peripheral-signal-path bonding pads 988D.

Figure 18:
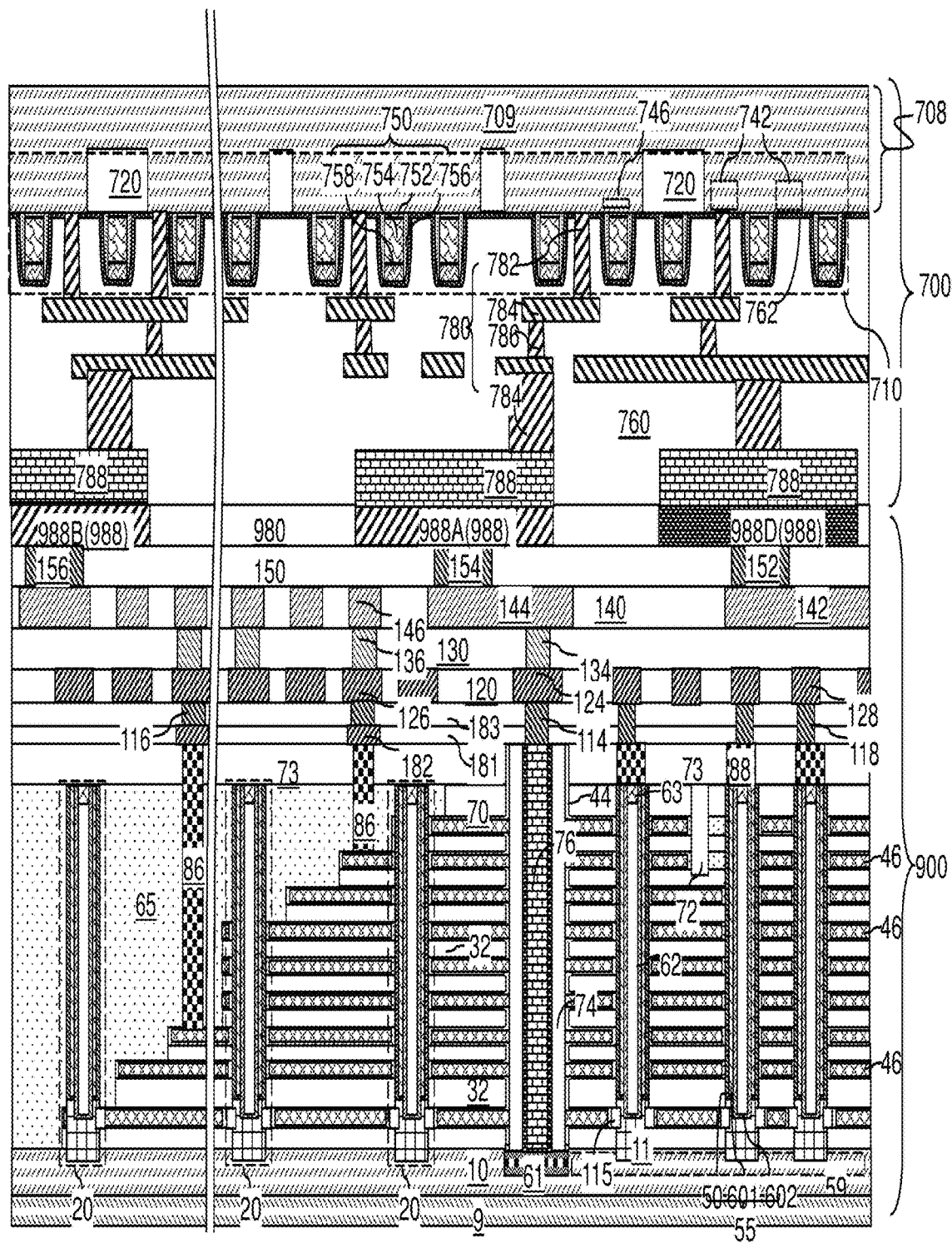
FIG. 18 is a vertical cross-sectional view of the three-dimensional memory device after thinning the support die according to an embodiment of the present disclosure.

Referring to FIG. 18, the support-die semiconductor layer 706 can be thinned from the backside, for example, by grinding to provide a thinned support-die semiconductor layer 709, which is a semiconductor material layer. The thinned support-die semiconductor layer 709 may have a thickness in a range from 1 micron to 100 microns, such as from 3 microns to 30 microns, although lesser and greater thicknesses may also be used.

Figure 19:
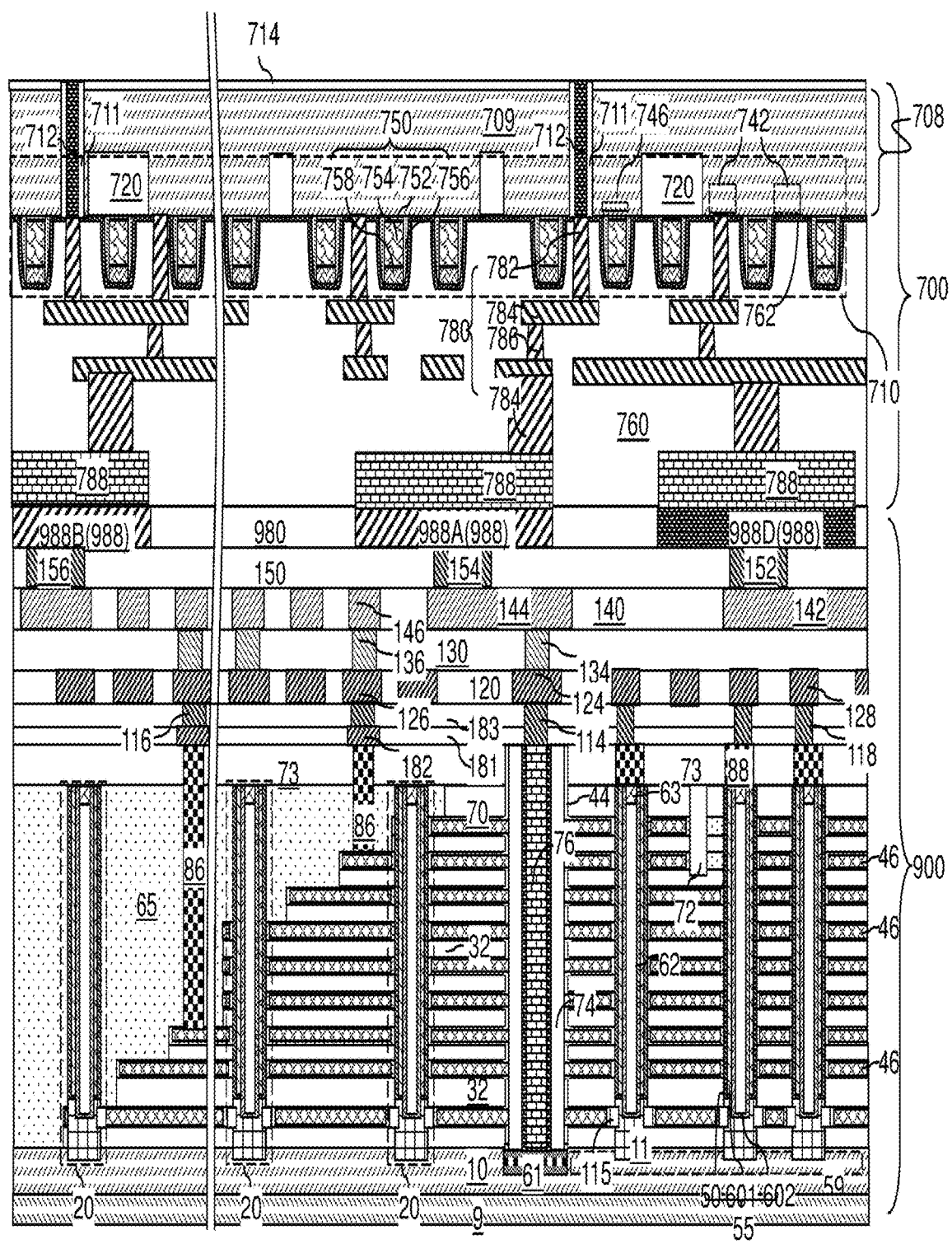
FIG. 19 is a vertical cross-sectional view of the three-dimensional memory device after formation of tubular insulating spacers and through-substrate via structures according to an embodiment of the present disclosure.

Referring to FIG. 19, a backside insulating layer 714 can be deposited on the backside surface of the thinned support-die semiconductor layer 709. The backside insulating layer 714 includes a dielectric material such as silicon oxide, and may have a thickness in a range from 30 nm to 1,000 nm, although lesser and greater thicknesses may also be used. A photoresist layer (not shown) can be applied over the backside of the thinned support-die semiconductor layer 709, and is lithographically patterned to form openings therein. The openings in the photoresist layer can be formed directly above a respective one of the support-die metal interconnect structures 780.

An anisotropic etch process can be performed using the photoresist layer as an etch mask layer to etch through the thinned support-die semiconductor layer 709 to a surface of a respective one of the support-die metal interconnect structures 780. Through-substrate via cavities are formed through the backside insulating layer 714 and the thinned support-die semiconductor layer 709. The photoresist layer can be subsequently removed, for example, by ashing. An insulating liner layer can be deposited in the through-substrate via cavities and over the backside insulating layer 714. Horizontal portions of the insulating liner layer can be removed from above the backside insulating layer 714 by an anisotropic etch process. Each remaining tubular portion of the insulating liner layer constitutes a tubular insulating spacer 711. The tubular insulating spacers 711 include a dielectric material such as silicon oxide, and may have a lateral thickness in a range from 10 nm to 300 nm between an inner sidewall and an outer sidewall. At least one conductive material such as a combination of a metallic liner (e.g., TiN) and a metallic fill material (e.g., W) can be deposited in remaining volumes of the through-substrate via cavities to form through-substrate via structures 712.

Figure 20:
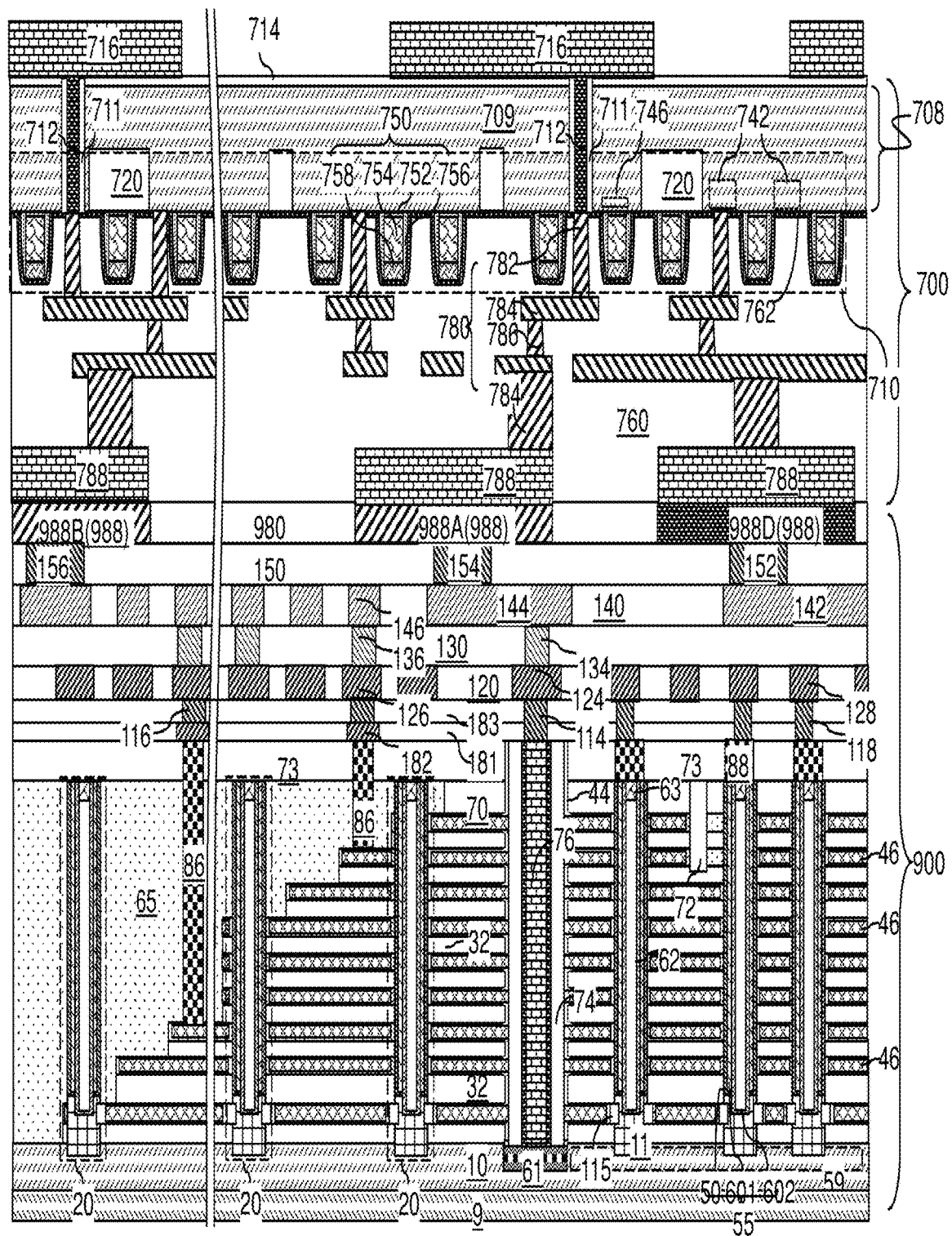
FIG. 20 is a vertical cross-sectional view of the three-dimensional memory device after formation of backside support-die bonding pads according to an embodiment of the present disclosure.

Referring to FIG. 20, external bonding pads 716 can be optionally formed directly on a respective one of the through-substrate via structures 712. In case the external bonding pads 716 are formed, the external bonding pads 716 may have a mirror image pattern of the pattern of the support-die bonding pads 788. Each combination of a through-substrate via structure 712 and an external bonding pad 716 constitutes a backside bonding structure (712, 716). Each of the backside bonding structures (712, 716) may comprise a through-substrate via structure 712 extending through a semiconductor substrate (comprising the support-die substrate 708) of the support die 700 and laterally electrically insulated from the semiconductor substrate by a tubular insulating spacer 711, and an external bonding pad 716 contacting the through-substrate via structure 712.

Figure 21:
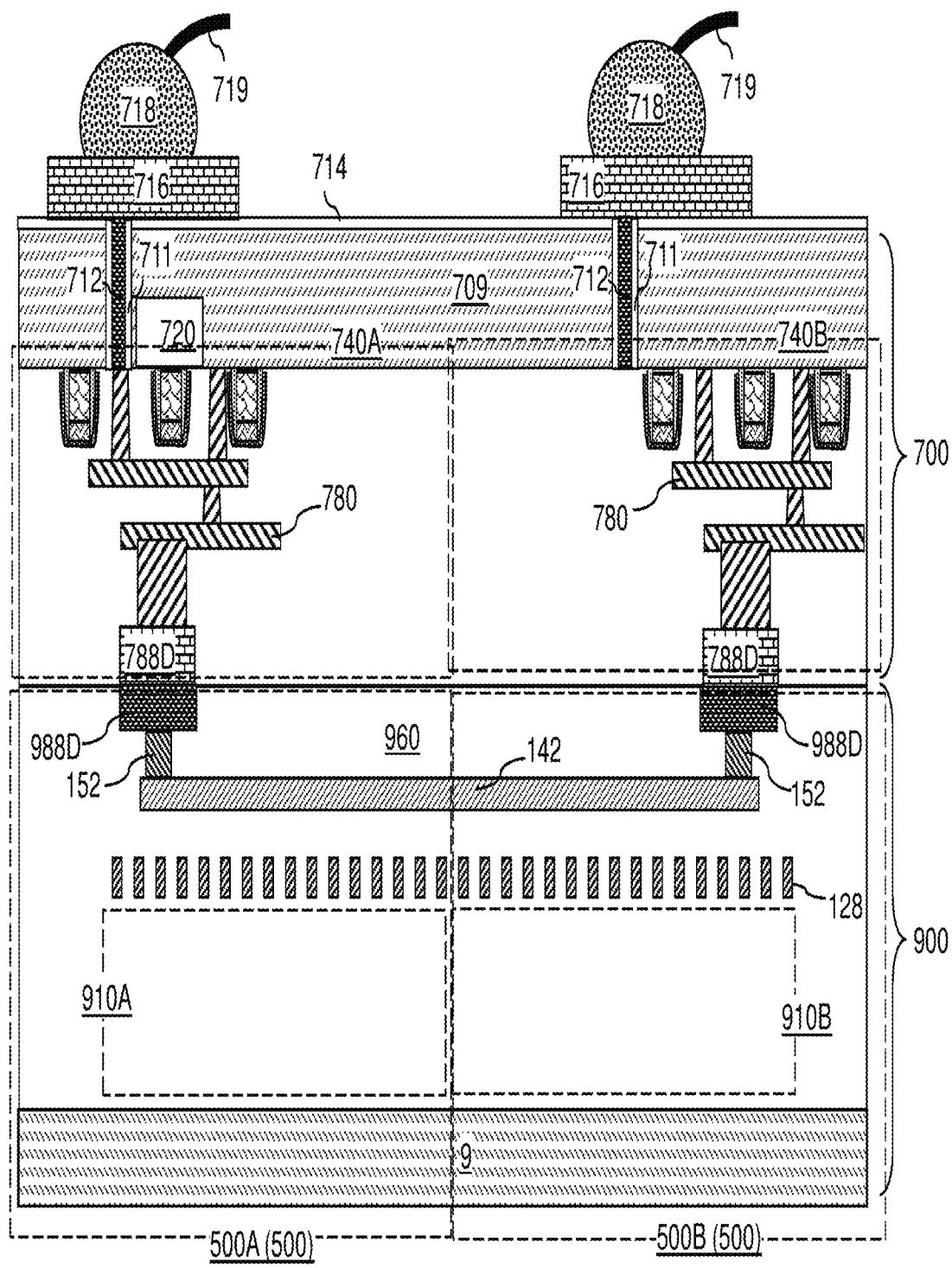
FIG. 21 is a schematic vertical cross-sectional view of the three-dimensional memory device after attaching bonding wires to the external bonding pads according to an embodiment of the present disclosure.

Referring to FIG. 21, a solder ball 718 can be bonded to each external bonding pad 716. A bonding wire 719 can be attached to each solder ball 718. The memory-die interconnect dielectric layers 960 within the memory die 900 can include each of the contact-level dielectric layer 73, the base-line-level dielectric layer 181, the connection-via-level dielectric layer 183, the first line-level dielectric layer 120, the first via-level dielectric layer 130, the second line-level dielectric layer 140, the second via-level dielectric layer 150, any additional line-level dielectric layer (if present), any additional via-level dielectric layer (if present), and the memory-side pad-level dielectric layer 980.

An electrically conductive path can be provided between two peripheral devices 710 through the memory die (e.g., through the interconnect 142 located in the memory device). In one embodiment, The electrically conductive path is provide between a respective node (e.g., source, drain or gate of a first peripheral transistor device 710) of a first peripheral circuitry 740A configured to control a first three-dimensional array 910A of memory elements in a first plane 500A in the memory die 900 and a respective node (e.g., source, drain or gate of a second peripheral transistor device 710) of a second peripheral circuitry 740B configured to control a second three-dimensional array 910B of memory elements in a second plane 500B in the memory die 900. Each electrically conductive path can include a first subset of the support-die metal interconnect structures 780 overlying, or underlying, the first peripheral circuitry 740A and electrically connected to a node of the first peripheral circuitry 740A, a first support-die peripheral-signal-path bonding pad 788D contacting or electrically connected to the first subset of the support-die metal interconnect structures 780, a first memory-die peripheral-signal-path bonding pad 988D bonded to the first support-die peripheral-signal-path bonding pad 788D, a first peripheral-signal-path metal via structure 152 contacting the first memory-die peripheral-signal-path bonding pad 988D, an interconnect, such as the peripheral-signal-path metal line 142 extending across two planes (500A, 500B) within the memory die 900 (e.g., above the bit lines 128) and including a first end portion that contacts the first peripheral-signal-path metal via structure 152, and a second end portion that contacts the second peripheral-signal-path metal via structure 152, a second memory-die peripheral-signal-path bonding pad 988D contacting the second peripheral-signal-path metal via structure 152, a second support-die peripheral-signal-path bonding pad 788D that is bonded to the second memory-die peripheral-signal-path bonding pad 988D, and a second subset of the support-die metal interconnect structures 780 overlying, or underlying, the second peripheral circuitry 740B, contacting or electrically connected to the second support-die peripheral-signal-path bonding pad 788D, with an electrical connection to a node of the second peripheral circuitry 740B.

Referring to all drawings and according to various embodiments of the present disclosure, a memory device includes a memory die 900 containing memory elements (910A, 910B), a support die 700 containing peripheral devices 710 bonded to the memory die 900, and an electrically conductive path 142 between two of the peripheral devices 710 which extends at least partially through the memory die 900. The electrically conductive path 142 is electrically isolated from the memory elements (910A, 910B).

In one embodiment, a method of operating the memory device includes providing an electrical signal between the two of the peripheral devices 710 through the electrically conductive path 142 without passing the through the memory elements (910A, 910B). As used herein, the term "the electrically conductive path is electrically isolated from the memory elements" means that the electrical signal from the first peripheral device to the second peripheral device passes through the electrically conductive path (e.g., interconnect 142) without passing through any of the memory devices. However, once the signal reaches the second peripheral device, it may be relayed to the memory device(s) through a different electrically conductive path. Furthermore, an electrical signal (e.g., a sense signal) may be provided from the memory device(s) to the first peripheral device and then it can be relayed from the first peripheral device to the second peripheral device through the electrically conductive path (e.g., interconnect 142) without passing through any of the memory devices.

In one embodiment, the memory device comprises a three-dimensional memory device and the memory elements comprise at least one three-dimensional array (910A, 910B) of memory elements. The memory die further comprises memory-die interconnect dielectric layers 960 including memory-die metal interconnect structures, and first memory-die bonding pads (such as the memory-die source-interconnect bonding pads 988A, the memory-die word-line-interconnect bonding pads 988B, and the memory-die bit-line-interconnect bonding pads 988C) that are located on or within the memory-die interconnect dielectric layers 960 and electrically connected to a respective node of the at least one three-dimensional array (910A, 910B) of memory elements through a first subset of the memory-die metal interconnect structures, wherein at least one electrically conductive path (988D, 152, 142) is provided in the memory-die interconnect dielectric layers 960, each at least one electrically conductive path (988D, 152, 142) is electrically isolated from the at least one three-dimensional array (910A, 910B) of memory elements, and each of the at least one electrically conductive path (988D, 152, 142) comprises a pair of second memory-die bonding pads (such as memory-die peripheral-signal-path bonding pads 988D) that are located on or within the memory-die interconnect dielectric layers 960, metal via structures (such as peripheral-signal-path metal via structures 152) contacting a respective one of the pair of second memory-die bonding pads, and a metal line (such as a peripheral-signal-path metal line 142) contacting the metal via structures.

The support die 700 comprises at least one peripheral circuitry (740A, 740B) containing the peripheral devices 710 and configured to generate control signals for, and receive sense signals from, the at least one three-dimensional array (910A, 910B) of memory elements. The support die 700 comprises first support-die bonding pads (such as the support-die source-interconnect bonding pads 788A, the support-die word-line-interconnect bonding pads 788B, and the support-die bit-line-interconnect bonding pads 788C) electrically connected to a respective node of the at least one peripheral circuitry (740A, 740B) through a first subset of support-die metal interconnect structures 780 within the support die 700.

The support die 700 is bonded to the memory die 900 to form a bonded assembly via the bonding pads. Specifically, the first support-die bonding pads (such as the support-die source-interconnect bonding pads 788A, the support-die word-line-interconnect bonding pads 788B, and the support-die bit-line-interconnect bonding pads 788C) are bonded to the first memory-die bonding pads (such as the memory-die source-interconnect bonding pads 988A, the memory-die word-line-interconnect bonding pads 988B, and the memory-die bit-line-interconnect bonding pads 988C). Each pair of second memory-die bonding pads (such as memory-die peripheral-signal-path bonding pads 988D) is bonded to a respective pair of second support-die bonding pads (such as support-die peripheral-signal-path bonding pads 788D) that are electrically connected to a respective node of the at least one peripheral circuitry (740A, 740B) through a second subset of support-die metal interconnect structures 780 within the support die 700.

In one embodiment, each of the at least one electrically conductive path (988D, 152, 142) is electrically isolated from the first subset of the memory-die metal interconnect structures 780.

In one embodiment, each metal line (such as a peripheral-signal-path metal line 142) within the at least one electrically conductive path (988D, 152, 142) is spaced from an interface between the memory die 900 and the support die 700.

In one embodiment, the at least one three-dimensional array (910A, 910B) of memory elements comprises a plurality of three-dimensional arrays (910A, 910B) of memory elements. In such embodiment, a metal line (such as a peripheral-signal-path metal line 142) within the at least one electrically conductive path (988D, 152, 142) laterally extends from a first region of the memory-die interconnect dielectric layers 960 located between a first three-dimensional array 910A of memory elements among the plurality of three-dimensional arrays (910A, 910B) of memory elements and an interface between the memory die 900 and the support die 700 and a second region of the memory-die interconnect dielectric layers 960 located between a second three-dimensional array 910B of memory elements among the plurality of three-dimensional arrays (910A, 910B) of memory elements and the interface between the memory die 900 and the support die 700.

In one embodiment, the memory die 900 comprises a plurality of planes (500A, 500B) configured to simultaneously execute a plurality of external commands; the first three-dimensional array 910A of memory elements is located within a first plane 500A of the plurality of planes (500A, 500B); and the second three-dimensional array 910B of memory elements is located within a second plane of the plurality of planes (500A, 500B).

In one embodiment, the first three-dimensional array 910A of memory elements comprises a first two-dimensional array of vertical NAND strings extending through a first alternating stack of first insulating layers 32 and first electrically conductive layers 46 located within the memory die 900; and the second three-dimensional array 910B of memory elements comprises a second two-dimensional array of vertical NAND strings extending through a second alternating stack of second insulating layers 32 and second electrically conductive layers 46 located within the memory die 900 and laterally spaced from the first two-dimensional array of vertical NAND strings by a dielectric material portion, which may include a retro-stepped dielectric material portion 65 and/or the memory-die interconnect dielectric layers 960.

In one embodiment, the three-dimensional memory device can comprise: first bit lines 128 electrically connected to a respective subset of vertical NAND strings within the first two-dimensional array of vertical NAND strings and located between the first two-dimensional array of vertical NAND strings and the interface between the memory die 900 and the support die 700; and second bit lines 128 electrically connected to a respective subset of vertical NAND strings within the second two-dimensional array of vertical NAND strings, located between the second two-dimensional array of vertical NAND strings and the interface between the memory die 900 and the support die 700, and electrically isolated from the first bit lines 128, wherein the metal line (such as a peripheral-signal-path metal line 142) is located between the interface between the memory die 900 and the support die 700 and a collection of the first bit lines 128 and the second bit lines 128.

In one embodiment, the at least one peripheral circuitry (740A, 740B) comprises a plurality of peripheral circuitries (740A, 740B) configured to control operation of a respective one of the plurality of three-dimensional arrays (910A, 910B) of memory elements.

In one embodiment, a first support circuitry region including a first support circuitry 740A among the plurality of peripheral circuitries (740A, 740B) faces the first region of the memory-die interconnect dielectric layers 960; a second support circuitry region including a second support circuitry 740B among the plurality of peripheral circuitries (740A, 740B) faces the second region of the memory-die interconnect dielectric layers 960; a node of the first support circuitry 740A is electrically connected to the metal line (such as the peripheral-signal-path metal line 142); and a node of the second support circuitry 740B is electrically connected to the metal line (such as the peripheral-signal-path metal line 142).

In one embodiment, the metal line is configured to transmit at least one control signal between the node of the first support circuitry 740A and the node of the second support circuitry 740B. The at least one control signal may be a clock signal, a read signal, a programming signal, a write signal, an abort signal, a synchronization signal, or any other signal that can be communicated between the first support circuitry 740A and the second support circuitry 740B to provide enhanced control of the memory die 900.

In one embodiment, the plurality of three-dimensional arrays (910A, 910B) of memory elements are provided within a plurality of planes (500A, 500B) configured to simultaneously execute a plurality of external commands; and the at least one control signal controls simultaneous execution of two external commands among the plurality of external commands in two planes (500A, 500B) among the plurality of planes that are controlled by the first support circuitry 740A and by the second support circuitry 740B.

In one embodiment, each of the at least one peripheral circuitry (740A, 740B) comprises: sense amplifier and bit line driver circuits; word line driver circuits; word line decoder circuits; source power supply circuits; and well bias voltage supply circuits.

In one embodiment, the three-dimensional memory device can comprise: through-substrate via structures 712 extending through a substrate (such as a thinned support-die semiconductor layer 709) of the support die 700, wherein the at least one peripheral circuitry (740A, 740B) is located on a first side of the substrate; and external bonding pads 716 located on a second side of the substrate and contacting a respective one of the through-substrate via structures 712.

According to another embodiment of the present disclosure, a method for forming a memory device comprises providing a memory die comprising memory elements and an interconnect which is electrically isolated from the memory elements, providing a support die comprising peripheral devices, and bonding the memory die to the support die such that an electrically conductive path between two of the peripheral devices includes the interconnect.

In one embodiment, the memory elements comprise at least one three-dimensional array of memory elements, and the memory die further comprises memory-die interconnect dielectric layers including memory-die metal interconnect structures, and first memory-die bonding pads that are located on or within the memory-die interconnect dielectric layers and electrically connected to a respective node of the at least one three-dimensional array of memory elements through a first subset of the memory-die metal interconnect structures, wherein the interconnect is provided in the memory-die interconnect dielectric layers, the electrically conductive path is electrically isolated from the at least one three-dimensional array of memory elements, and the electrically conductive path comprises a pair of second memory-die bonding pads that are located on or within the memory-die interconnect dielectric layers, metal via structures contacting a respective one of the pair of second memory-die bonding pads, and a metal line contacting the metal via structures. The support die comprises at least one peripheral circuitry containing the peripheral devices configured to generate control signals for, and receive sense signals from, the at least one three-dimensional array of memory elements, wherein the support die comprises first support-die bonding pads electrically connected to a respective node of the at least one peripheral circuitry through a first subset of support-die metal interconnect structures within the support die. The first support-die bonding pads are bonded to the first memory-die bonding pads during bonding, and each pair of second memory-die bonding pads is bonded to a respective pair of second support-die bonding pads that are electrically connected to a respective node of the at least one peripheral circuitry through a second subset of support-die metal interconnect structures within the support die.

The various embodiments of the present disclosure can be used to provide a signal routing path within the memory die 900 for signal transmission between nodes of the support die 700. Electrical wiring density in the support die 700 can be high, and long electrical wiring lengths and/or an increased number of wiring levels may be provided to route the wiring between the bit line driver circuits around the word line driver circuits where the WLTR/LVDEC regions shown in FIG. 16B are located between adjacent sense amplifiers. Embodiments of the present disclosure route a subset of the electrically conductive paths between different bit line driver circuit elements through the memory die 900 where there is additional space available above the bit lines. The total wiring lengths and/or the total number of wiring levels in the support die 700 can be reduced by using the electrical wiring schemes of various embodiments of the present disclosure.

Although the foregoing refers to particular preferred embodiments, it will be understood that the disclosure is not so limited. It will occur to those of ordinary skill in the art that various modifications can be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims can be practiced with any other compatible structures and/or configurations that are functionally equivalent provided that such substitutions are not explicitly for-

What is claimed is:

1. A memory device comprising:
a memory die comprising memory elements and memory-side interconnect dielectric layers;
a support die comprising peripheral devices and support-side dielectric layers, wherein the support die is bonded to the memory die; and
an electrically conductive path between two of the peripheral devices extends at least partially through the memory die, wherein the electrically conductive path is electrically isolated from the memory elements and comprises a pair of memory-die bonding pads that are located on or within the memory-die interconnect dielectric layers, metal via structures contacting a respective one of the pair of memory-die bonding pads, and a metal line contacting the metal via structures.

2. The memory device of claim 1, wherein the metal line is embedded within and is in contact with one of the memory-side interconnect dielectric layers.

3. The memory device of claim 2, wherein the metal via structures are embedded within and is in contact with at least one of the memory-side interconnect dielectric layers.

4. The memory device of claim 1, wherein an entirety of a combination of the pair of memory-die bonding pads, the metal via structures, and the metal line are located within the memory die.

5. The memory device of claim 1, wherein each memory-die bonding pad within the pair of memory-die bonding pads is bonded to a respective support-die bonding pad that is located within the logic die and is electrically connected to a respective node of at least one of the peripheral devices.

6. The memory device of claim 1, wherein the metal line within the electrically conductive path is spaced from an interface between the memory die and the support die.

7. The memory device of claim 1, wherein:
the memory elements comprise three-dimensional memory elements;
the memory die further comprises additional memory-die bonding pads electrically connected to a respective node of the three-dimensional memory elements;
the support die further comprises additional support-die bonding pads that are bonded to the additional memory-die bonding pads and electrically connected to a respective node of the peripheral devices.

8. The memory device of claim 7, wherein:
three-dimensional memory elements comprise a plurality of three-dimensional arrays of memory elements; and
the metal line within the electrically conductive path laterally extends from a first region of the memory-die interconnect dielectric layers located between a first three-dimensional array of memory elements of the plurality of three-dimensional arrays of memory elements and an interface between the memory die and the support die and a second region of the memory-die interconnect dielectric layers located between a second three-dimensional array of memory elements of the plurality of three-dimensional arrays of memory elements and the interface between the memory die and the support die.

9. The memory device of claim 8, wherein:
the memory die comprises a plurality of planes configured to simultaneously execute a plurality of external commands;
the first three-dimensional array of memory elements is located within a first plane of the plurality of planes; and
the second three-dimensional array of memory elements is located within a second plane of the plurality of planes.

10. The memory device of claim 8, wherein:
the first three-dimensional array of memory elements comprises a first two-dimensional array of vertical NAND strings extending through a first alternating stack of first insulating layers and first electrically conductive layers located within the memory die; and
the second three-dimensional array of memory elements comprises a second two-dimensional array of vertical NAND strings extending through a second alternating stack of second insulating layers and second electrically conductive layers located within the memory die and laterally spaced from the first two-dimensional array of vertical NAND strings by a dielectric material portion.

11. The memory device of claim 10, further comprising:
first bit lines electrically connected to a respective subset of vertical NAND strings within the first two-dimensional array of vertical NAND strings and located between the first two-dimensional array of vertical NAND strings and the interface between the memory die and the support die; and
second bit lines electrically connected to a respective subset of vertical NAND strings within the second two-dimensional array of vertical NAND strings, located between the second two-dimensional array of vertical NAND strings and the interface between the memory die and the support die, and electrically isolated from the first bit lines,
wherein the metal line is located between the interface between the memory die and the support die, and between the first bit lines and the second bit lines.

12. The memory device of claim 8, wherein the peripheral devices comprises a plurality of peripheral circuitries configured to control operation of a respective one of the plurality of three-dimensional arrays of memory elements.

13. The memory device of claim 12, wherein:
a first peripheral circuitry of the plurality of peripheral circuitries faces the first region of the memory-die interconnect dielectric layers;
a second peripheral circuitry of the plurality of peripheral circuitries faces the second region of the memory-die interconnect dielectric layers;
a node of the first peripheral circuitry is electrically connected to the metal line; and
a node of the second peripheral circuitry is electrically connected to the metal line.

14. The memory device of claim 13, wherein:
the metal line is configured to transmit at least one control signal between the node of the first peripheral circuitry and the node of the second peripheral circuitry;
the plurality of three-dimensional arrays of memory elements are provided within a plurality of planes configured to simultaneously execute a plurality of external commands; and
the at least one control signal controls simultaneous execution of two external commands of the plurality of external commands in two planes of the plurality of planes that are controlled by the first peripheral circuitry and by the second peripheral circuitry.

15. The memory device of claim 7, wherein the additional support-die bonding pads are bonded to the additional memory-die bonding pads by metal-to-metal bonding.

16. The memory device of claim 1, further comprising:
- through-substrate via structures extending through a substrate of the support die; and
- external bonding pads located on a second side of the substrate and contacting a respective one of the through-substrate via structures.

17. The memory device of claim 1, wherein each of pair of memory-die bonding pads is bonded to a respective support-side bonding pad within the support die by metal-to-metal bonding.

18. A method of operating a memory device, comprising:
providing a memory device that comprises:
- a memory die comprising memory elements and memory-side interconnect dielectric layers,
- a support die comprising peripheral devices and support-side dielectric layers, wherein the support die is bonded to the memory die, and
- an electrically conductive path between two of the peripheral devices extends at least partially through the memory die, wherein the electrically conductive path is electrically isolated from the memory elements and comprises a pair of memory-die bonding pads that are located on or within the memory-die interconnect dielectric layers, metal via structures contacting a respective one of the pair of memory-die bonding pads, and a metal line contacting the metal via structures; and providing an electrical signal between the two of the peripheral devices through the electrically conductive path without passing through the memory elements.

19. A method for forming a memory device, comprising:
providing a memory die comprising memory elements, memory-side interconnect dielectric layers, and an interconnect which is electrically isolated from the memory elements, wherein the interconnect comprises a pair of memory-die bonding pads that are located on or within the memory-die interconnect dielectric layers, metal via structures contacting a respective one of the pair of memory-die bonding pads, and a metal line contacting the metal via structures;

providing a support die comprising peripheral devices; and bonding the memory die to the support die such that an electrically conductive path between two of the peripheral devices includes the interconnect and is electrically isolated from the memory elements.

20. The method of claim 3, wherein the metal line is embedded within and is in contact with one of the memory-side interconnect dielectric layers.

* * * * *